United States Patent
Gaul et al.

(10) Patent No.: US 12,249,643 B2
(45) Date of Patent: Mar. 11, 2025

(54) STACKED PLANAR FIELD EFFECT TRANSISTORS WITH 2D MATERIAL CHANNELS

(71) Applicant: INTERNATIONAL BUSINESS MACHINES CORPORATION, Armonk, NY (US)

(72) Inventors: Andrew Gaul, Halfmoon, NY (US); Julien Frougier, Albany, NY (US); Ruilong Xie, Niskayuna, NY (US); Andrew M. Greene, Slingerlands, NY (US); Christopher J. Waskiewicz, Rexford, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 274 days.

(21) Appl. No.: 17/482,940

(22) Filed: Sep. 23, 2021

(65) Prior Publication Data

US 2023/0093343 A1    Mar. 23, 2023

(51) Int. Cl.
*H01L 29/76*    (2006.01)
*H01L 21/02*    (2006.01)
(Continued)

(52) U.S. Cl.
CPC .... *H01L 29/7606* (2013.01); *H01L 21/02568* (2013.01); *H01L 21/0259* (2013.01);
(Continued)

(58) Field of Classification Search
CPC .......... H01L 29/7606; H01L 21/02568; H01L 21/0259; H01L 29/0665; H01L 29/24;
(Continued)

(56) References Cited

U.S. PATENT DOCUMENTS 8,471,249 B2    6/2013  Chiu et al.
8,679,902 B1    3/2014  Basker et al.
(Continued)

FOREIGN PATENT DOCUMENTS

CN    103855091 A    6/2014
CN    105470001 A    4/2016
(Continued)

OTHER PUBLICATIONS

International Search Report issued in corresponding PCT Application Serial No. PCT/CN2022/103614 dated Sep. 23, 2022, pp. 1-10.

*Primary Examiner* — Jami Valentine Miller
*Assistant Examiner* — Zhijun Xu
(74) *Attorney, Agent, or Firm* — Tutunjian & Bitetto, P.C.; Samuel Waldbaum

(57) ABSTRACT

A stacked device is provided. The stacked device includes a plurality of dielectric support bridges on a substrate, and a first two-dimensional (2D) channel layer on each of the plurality of dielectric support bridges. The stacked device further includes a gate dielectric sheet on the first two-dimensional (2D) channel layer, and a second two-dimensional (2D) channel layer on the first two-dimensional (2D) channel layer. The stacked device further includes a second gate dielectric layer on the gate dielectric sheets.

20 Claims, 17 Drawing Sheets

(51) Int. Cl.
*H01L 29/06* (2006.01)
*H01L 29/24* (2006.01)
*H01L 29/423* (2006.01)
*H01L 29/66* (2006.01)
*H01L 29/786* (2006.01)

(52) U.S. Cl.
CPC .......... *H01L 29/0665* (2013.01); *H01L 29/24* (2013.01); *H01L 29/42392* (2013.01); *H01L 29/66969* (2013.01); *H01L 29/78618* (2013.01); *H01L 29/78696* (2013.01)

(58) Field of Classification Search
CPC ......... H01L 29/42392; H01L 29/66969; H01L 29/78618; H01L 29/78696; H01L 21/0243; H01L 21/02565; H01L 29/0649; H01L 29/0847; H01L 29/1606; H01L 29/66045; H01L 29/778
USPC .......................................................... 257/29
See application file for complete search history.

(56) References Cited

U.S. PATENT DOCUMENTS

| | | | |
|---|---|---|---|
| 8,742,511 B2 | 6/2014 | Chang et al. | |
| 8,916,914 B2 | 12/2014 | Kim et al. | |
| 9,349,806 B2 | 5/2016 | Ho et al. | |
| 9,490,323 B2 | 11/2016 | Rodder et al. | |
| 9,508,801 B2 | 11/2016 | Franklin et al. | |
| 9,548,394 B2 | 1/2017 | Das et al. | |
| 9,553,199 B2 | 1/2017 | Hou et al. | |
| 9,748,352 B2 | 8/2017 | Liu et al. | |
| 9,812,449 B2 | 11/2017 | Obradovic et al. | |
| 10,134,915 B2 | 11/2018 | Colinge et al. | |
| 10,236,292 B1 | 3/2019 | Frougier et al. | |
| 10,304,833 B1 | 5/2019 | Suvarna et al. | |
| 10,340,361 B2 | 7/2019 | Nemouchi et al. | |
| 10,388,732 B1 | 8/2019 | Frougier et al. | |
| 10,418,449 B2 | 9/2019 | Paul et al. | |
| 10,510,622 B1 | 12/2019 | Frougier et al. | |
| 10,622,476 B2 | 4/2020 | Park et al. | |
| 10,734,384 B1 | 8/2020 | Li et al. | |
| 10,818,803 B1 * | 10/2020 | Frougier | H01L 29/1054 |
| 10,872,973 B2 | 12/2020 | Lin et al. | |
| 11,004,606 B2 | 5/2021 | Adamson et al. | |
| 2012/0138887 A1 | 6/2012 | Zhang et al. | |
| 2012/0273763 A1 | 11/2012 | Banerjee et al. | |
| 2016/0190343 A1 | 6/2016 | Hou et al. | |
| 2016/0211264 A1 | 7/2016 | Peng | |
| 2017/0040321 A1 | 2/2017 | Mitard | |
| 2017/0317206 A1 | 11/2017 | van Dal et al. | |
| 2018/0182898 A1 | 6/2018 | Moroz et al. | |
| 2021/0028280 A1 * | 1/2021 | Liu | H01L 29/24 |
| 2021/0126110 A1 * | 4/2021 | Lin | H01L 21/823481 |
| 2021/0135015 A1 * | 5/2021 | Frougier | H01L 29/778 |

FOREIGN PATENT DOCUMENTS

| | | |
|---|---|---|
| CN | 112133697 A | 12/2020 |
| CN | 112750908 A | 5/2021 |
| EP | 3255656 A1 | 12/2017 |
| WO | 2011160922 A1 | 12/2011 |

\* cited by examiner

STACKED PLANAR FIELD EFFECT TRANSISTORS WITH 2D MATERIAL CHANNELS

BACKGROUND

The present invention generally relates to 2D Channel Transistors, and more particularly to stacked, planar, 2D-channel field effect transistors.

A Field Effect Transistor (FET) typically has a source, a channel, and a drain, where current flows from the source to the drain, and a gate that controls the flow of current through the device channel. Field Effect Transistors (FETs) can have a variety of different structures, for example, FETs have been fabricated with the source, channel, and drain formed in the substrate material itself, where the current flows horizontally (i.e., in the plane of the substrate), and FinFETs have been formed with the channel extending outward from the substrate. Depending on the doping of the source and drain, an n-FET or a p-FET can be formed.

SUMMARY

In accordance with an embodiment of the present invention, a stacked device is provided. The stacked device includes a plurality of dielectric support bridges on a substrate, and a first two-dimensional (2D) channel layer on each of the plurality of dielectric support bridges. The stacked device further includes a gate dielectric sheet on the first two-dimensional (2D) channel layer, and a second two-dimensional (2D) channel layer on the first two-dimensional (2D) channel layer. The stacked device further includes a second gate dielectric layer on the gate dielectric sheets.

In accordance with another embodiment of the present invention, a stacked device is provided. The stacked device includes a bottom dielectric layer on a substrate, and a plurality of dielectric support bridges on the bottom dielectric layer. The stacked device further includes a first two-dimensional (2D) channel layer on each of the plurality of dielectric support bridges and on the bottom dielectric layer, and a gate dielectric sheet on the first two-dimensional (2D) channel layer. The stacked device further includes a second two-dimensional (2D) channel layer on the first two-dimensional (2D) channel layer, and a second gate dielectric layer on the gate dielectric sheets.

In accordance with yet another embodiment of the present invention, a method of forming a stacked device is provided. The method includes forming one or more stacks of alternating sacrificial layers and bridging layers on a substrate, and removing the sacrificial layers to expose opposite sides of the bridging layers. The method further includes converting the bridging layers to dielectric support bridges, and forming a first two-dimensional (2D) channel layer on the exposed surfaces of the dielectric support bridges. The method further includes forming a first gate dielectric layer on the two-dimensional (2D) channel layer, and forming disposable filler sections between the dielectric support bridges. The method further includes forming a second two-dimensional (2D) channel layer on the first two-dimensional (2D) channel layer.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention provide fabrication of stacked devices with 2D-material channel(s), that can provide scaling and/or performance benefits. Using a stacked, planar, 2D-channel configuration, current density is improved for high-performance applications, compared to other nanosheet-type devices. Stacked, planar, 2D-channel FETs can provide higher current density than either gate-all-around (GAA) silicon (Si) nanosheets or GAA 2D nanosheets, for 1) various 2D layer thicknesses and 2) for various $W_{sheet}$ (nanosheet width) from SRAM to logic. Inherently lower short channel effects (SCE) in 2D materials allows for gate length scaling. 2D materials can carry similar effective on-state current as Si channels, with significantly thinner channels (mono/bi layer 2D channel vs. ~5 nm thick Si channel), thus allowing more channels to be built in a stack, thus giving higher overall current density. A wrap-around-contact can provide for improved (reduced) contact resistance through increased interface surface area, where material selection can reduce a Schottky barrier/resistance.

Embodiments of the present invention can provide both n-type field effect transistor (nFET) devices and p-type field effect transistor (pFET) devices, where nFET and pFET devices can be formed by adjusting the materials of the 2D-material channels, the contact doping, and source/drain metal(s).

Embodiments of the present invention provide nFET/pFET multi-Vt (threshold voltage) enabled by channel replacement integration, where all multi-Vt stacks are formed using a process sequence, after forming the 2D-material channel. Multi-Vt can be formed in replacement metal gate (RMG) structures.

Embodiments of the present invention provide methods of fabricating stacked devices with 2D-material channel(s), and nFET/pFET multi-Vt (threshold voltage) devices.

Exemplary applications/uses to which the present invention can be applied include, but are not limited to: front-end-of-line (FEOL) and/or back-end-of-line (BEOL) logic structures/applications.

It is to be understood that aspects of the present invention will be described in terms of a given illustrative architecture; however, other architectures, structures, substrate materials and process features and steps can be varied within the scope of aspects of the present invention.

Figure 1:
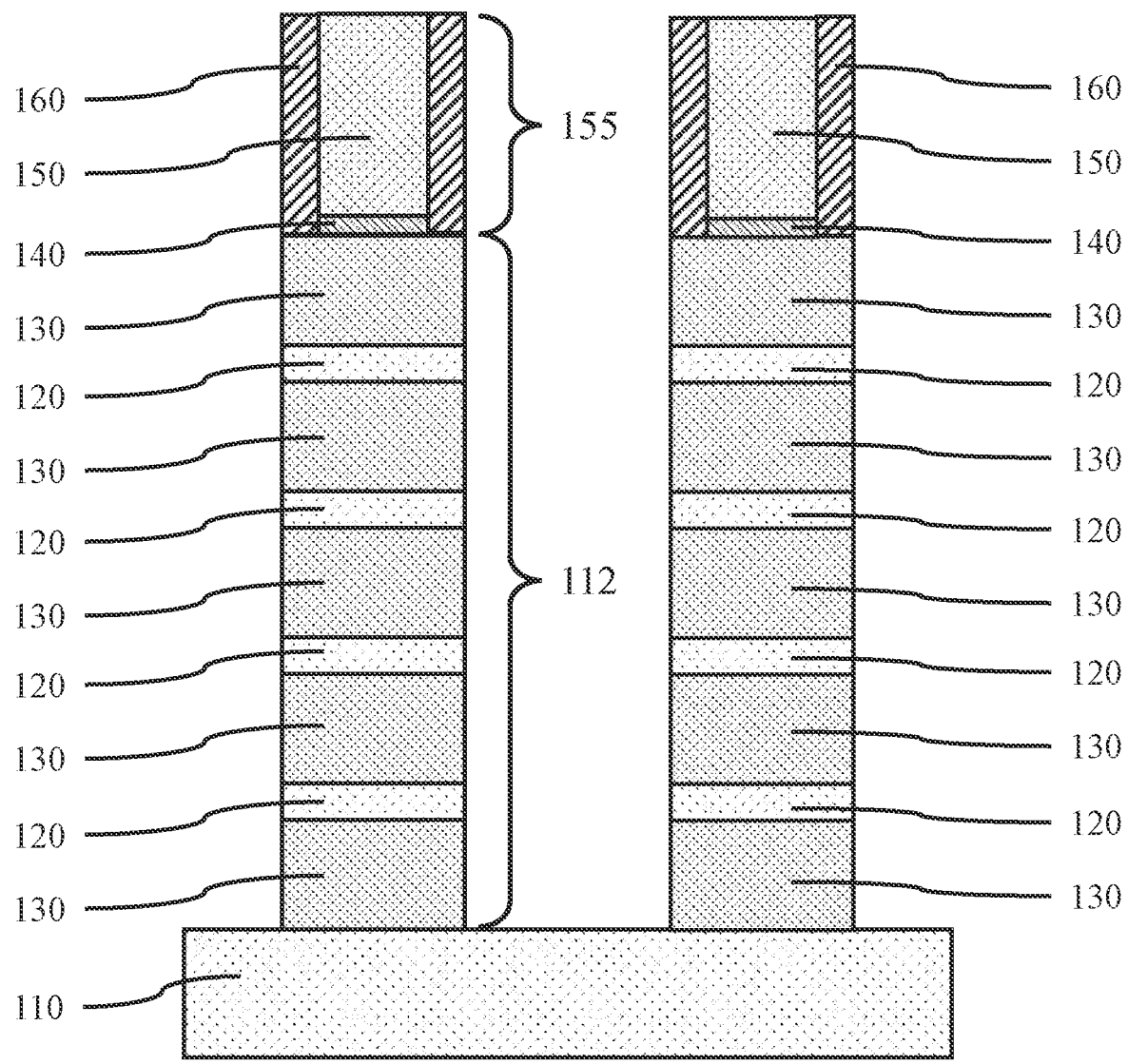
FIG. 1 is a cross-sectional side view showing a plurality of stacks of alternating sacrificial layers and bridging layers on a substrate, and a dummy gate structure on each of the stacks, in accordance with an embodiment of the present invention.

Referring now to the drawings in which like numerals represent the same or similar elements and initially to FIG. 1, FIG. 1 is a cross-sectional side view showing a plurality of stacks of alternating sacrificial layers and bridging layers on a substrate, and a dummy gate structure on each of the stacks, in accordance with an embodiment of the present invention.

In one or more embodiments, one or more stacks 112 of alternating sacrificial layers 130 and bridging layers 120 can be formed on a substrate 110, where the sacrificial layers 130 and bridging layers 120 can be a combination of materials that can be selectively etched relative to each other. A dummy gate structure 155 can be on each of the one or more stacks 112 of alternating sacrificial layers 130 and bridging layers 120, where the dummy gate structure 155 can be used as a mask template to trimming back layers on the substrate. The dummy gate structure 155 can include a dummy dielectric layer 140, dummy gate fill 150, and sidewall spacers 160.

In one or more embodiments, the substrate 110 can be a semiconductor material, including, but not limited to a type IV semiconductor (e.g., silicon (Si), germanium (Ge), a IV-IV compound semiconductor (e.g., silicon germanium (SiGe), silicon carbide (SiC), a III-V compound semiconductor (e.g., gallium arsenide (GaAs), gallium nitride (GaN), a II-VI compound semiconductor (e.g., Cadmium selenide (CdSe), Cadmium sulfide (CdS), Cadmium telluride (CdTe), zinc oxide (ZnO)). The substrate 110 can be a single crystal material wafer, a polycrystalline material wafer, or a semiconductor-on-insulator (SeOI) wafer.

In various embodiments, the bridging layers 120 can be silicon (Si) and the sacrificial layers 130 can be silicon-germanium (SiGe), where the sacrificial layers 130 can have a germanium concentration in a range of about 25 atomic percent (at. %) to about 75 at. %, or about 40 at. % to about 60 at. %, or about 50 at. % germanium (Ge) to allow selective removal of the sacrificial layers 130. The sacrificial layers 130 and bridging layers 120 can be formed by epitaxial growth on the substrate 110 In various embodiments, combinations of materials other than Si and SiGe, for example, various combinations of dielectric materials having etch selectivity can be formed by conformal depositions, such as atomic layer deposition (ALD) and/or plasma enhanced atomic layer deposition (PEALD).

In various embodiments, the bridging layers 120 can have a thickness in a range of about 3 nanometers (nm) to about 7 nm, or about 4 nm to about 6 nm, or about 5 nm, although other thicknesses are also contemplated. The bridging layers 120 can have a thickness sufficient to allow formation of a dielectric support bridge that can provide structural support to a two-dimensional (2D) channel layer. Gate length reduction below 12 nm is limited by: 1) SCE for $\geq 5$ nm $T_{Si}$ or 2) quantum confinement effects degrading $R_{channel}$ for $T_{Si}<5$ nm, where SCE can include subthreshold leakage, DIBL, etc. If a Si channel thickness is significantly (1-3 nm) greater than 5 nm, gate control over the channel is weakened so it is easy to have short channel effects. If the Si channel is significantly thinner (1-3 nm) than 5 nm, quantum confinement increases the resistance of the channel such that the device is no longer capable of carrying useful levels of electrical current.

In various embodiments, the sacrificial layers 130 can have a thickness in a range of about 7 nanometers (nm) to about 15 nm, or about 9 nm to about 12 nm, or about 11 nm, although other thicknesses are also contemplated. The sacrificial layers 130 can have a thickness sufficient to allow formation of an active gate structure on the two-dimensional (2D) channel layer.

In various embodiments, the stack can include between four (4) to six (6) bridging layers 120 and an equal number of sacrificial layers 130 where a bottom sacrificial layers 130 is closest to the surface of the substrate 110.

In various embodiments, the bridging layers 120 and sacrificial layers 130 can have a width in a range of about 15 nanometers (nm) to about 100 nm, or about 25 nm to about 75 nm, or about 50 nm, and a length in a range of about 10 nanometers (nm) to about 100 nm, or about 12 nm to about 75 nm, or about 50 nm, although other widths and lengths are also contemplated. In various embodiments, the bridging layers 120 and sacrificial layers 130 can be from about 12 nm×15 nm to about 100 nm×100 nm, or about 50 nm×50 nm, although other sizes are also contemplated.

In various embodiments, the height of a stack 112 of alternating sacrificial layers 130 and bridging layers 120 can be in the range of about 60 nm to about 75 nm, or about 62 nm to about 70, although other heights are also contemplated. The height can depend on the thicknesses of each individual layer in the stack of layers, and the aspect ratio achievable by the directional etching of the sacrificial layers 130 and bridging layers 120.

In various embodiments, the dummy dielectric layer 140 can be an insulating, dielectric material, including, but not limited to, silicon oxide (SiO), silicon nitride (SiN), a silicon oxynitride (SiON), a silicon carbonitride (SiCN), a silicon boronitride (SiBN), a silicon borocarbide (SiBC), and combinations thereof.

In various embodiments, the sidewall spacers 160 can be a hardmask material, including, but not limited to, silicon oxide (SiO), silicon nitride (SiN), a silicon oxynitride (SiON), a silicon carbonitride (SiCN), a silicon boronitride (SiBN), a silicon borocarbide (SiBC), and combinations thereof. The dummy dielectric layer 140 can be a material that is selectively etchable relative to the sidewall spacers 160.

In various embodiments, the dummy gate fill 150 can be a selectively-etchable material relative to the sidewall spacers 160 and dummy dielectric layer 140, for example, amorphous silicon (a-Si), amorphous carbon (a-C), amorphous germanium (a-Ge), and combinations thereof.

Figure 2:
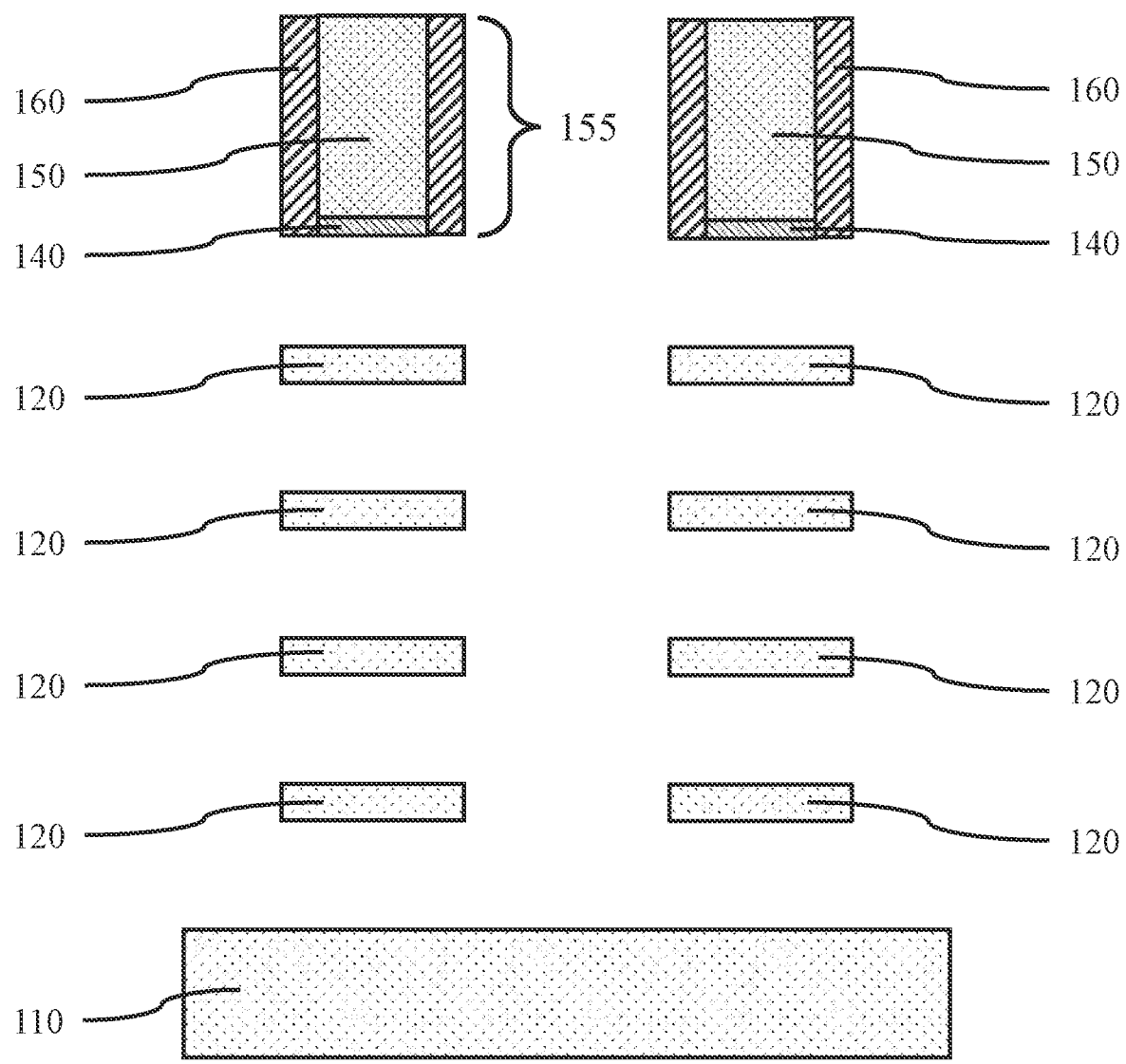
FIG. 2 is a cross-sectional side view showing two separate stacks of bridging layers on a substrate after removing the sacrificial layers, and a dummy gate structure on each of the stacks, in accordance with an embodiment of the present invention.

FIG. 2 is a cross-sectional side view showing two separate stacks of bridging layers on a substrate after removing the sacrificial layers, and a dummy gate structure on each of the stacks, in accordance with an embodiment of the present invention.

In one or more embodiments, the sacrificial layers 130 are selectively removed, where the sacrificial layers 130 can be removed using a selective, isotropic etch, for example, a wet chemical etch, dry plasma etch, or combination thereof. Removal of the sacrificial layers 130 can leave the bridging layers 120 supported by material at opposite ends of the stack, which can include the dummy gate fill 150 and sidewall spacers 160 of the dummy gate structure 155 and/or oxide spacers. Removal of the bottom sacrificial layer 130 can expose a portion of the substrate surface beneath the bridging layers 120.

Figure 3:
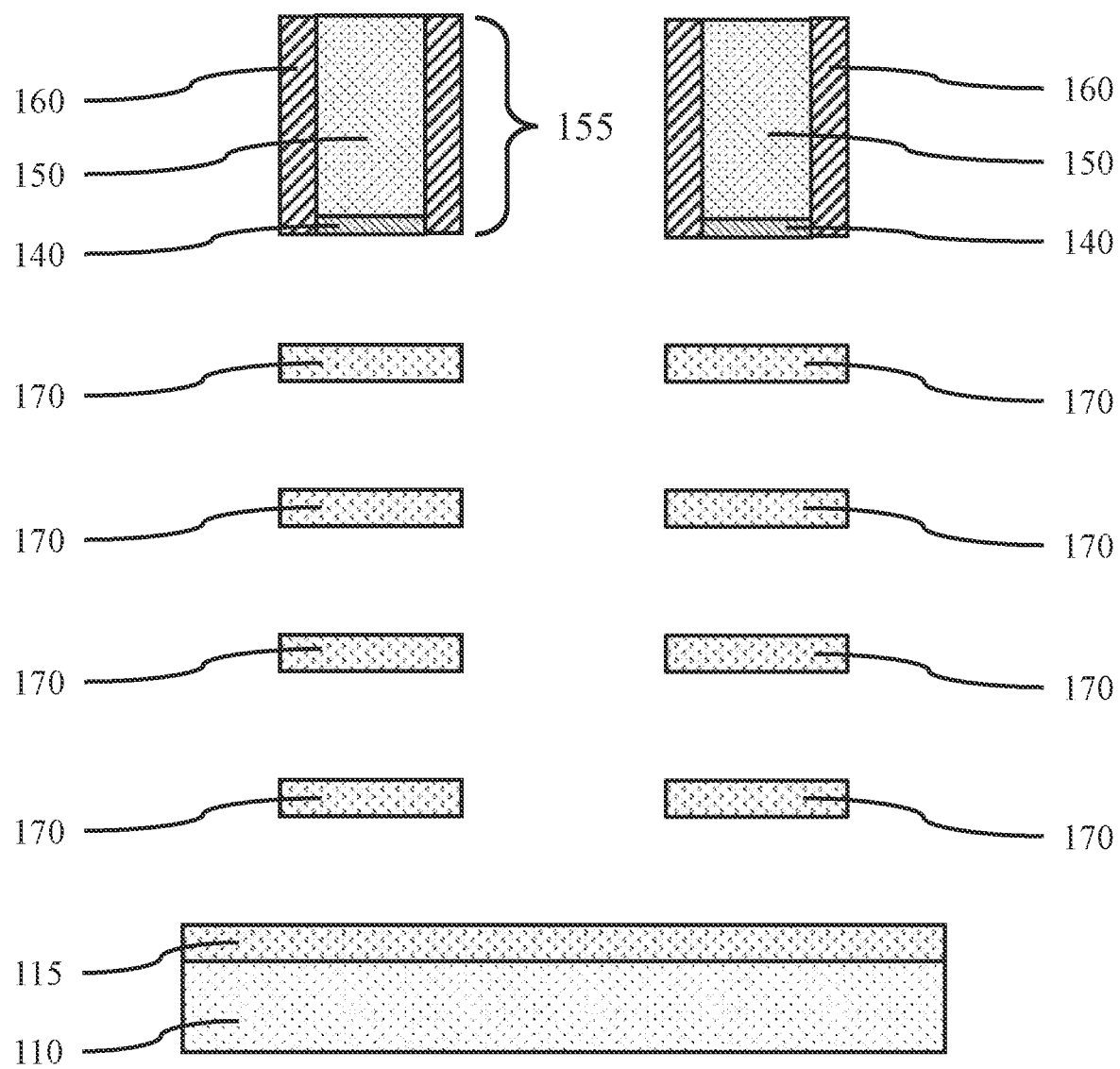
FIG. 3 is a cross-sectional side view showing the bridging layers of each of the stacks converted to dielectric support bridges, and a bottom dielectric layer formed on the substrate, in accordance with an embodiment of the present invention.

FIG. 3 is a cross-sectional side view showing the bridging layers of each of the stacks converted to dielectric support bridges, and a bottom dielectric layer formed on the substrate, in accordance with an embodiment of the present invention.

In various embodiments, the bridging layers 120 themselves can be a semiconductor that can be converted to an electrically insulating material, or an insulating dielectric material, for example, silicon oxide (SiO), including silicon dioxide ($SiO_2$), silicon nitride (SiN), silicon oxynitride (SiON), and combinations thereof. The stack(s), including the bridging layers 120 and sacrificial layers 130, could be made from dielectric materials that are selectively etchable relative to each other.

In one or more embodiments, the bridging layers 120 can be converted into dielectric support bridges 170 through a chemical reaction, for example, an oxidation process. The oxidation process can be, for example, a thermal oxidation, a wet oxidation, a dry, plasma oxidation, and combinations thereof. In a non-limiting exemplary embodiment, silicon (Si) bridging layers 120 can be converted into silicon dioxide ($SiO_2$) dielectric support bridges 170 through a thermal oxidation process.

In various embodiments, the bridging layers 120/dielectric support bridges 170 would sustain 2 MV/cm, which for example corresponds to about a 4 nm thickness with a low-k SiOCN spacer.

In various embodiments, the chemical reaction can also convert a top portion of the substrate 110 to a bottom dielectric layer 115, where for example, an oxidation process can form a silicon oxide (SiO) bottom dielectric layer 115. In various embodiments, the bottom dielectric layer 115 can have a thickness of about half the thickness of the bridging layers 120/dielectric support bridges 170 due to reactant diffusion into the substrate surface.

Figure 4:
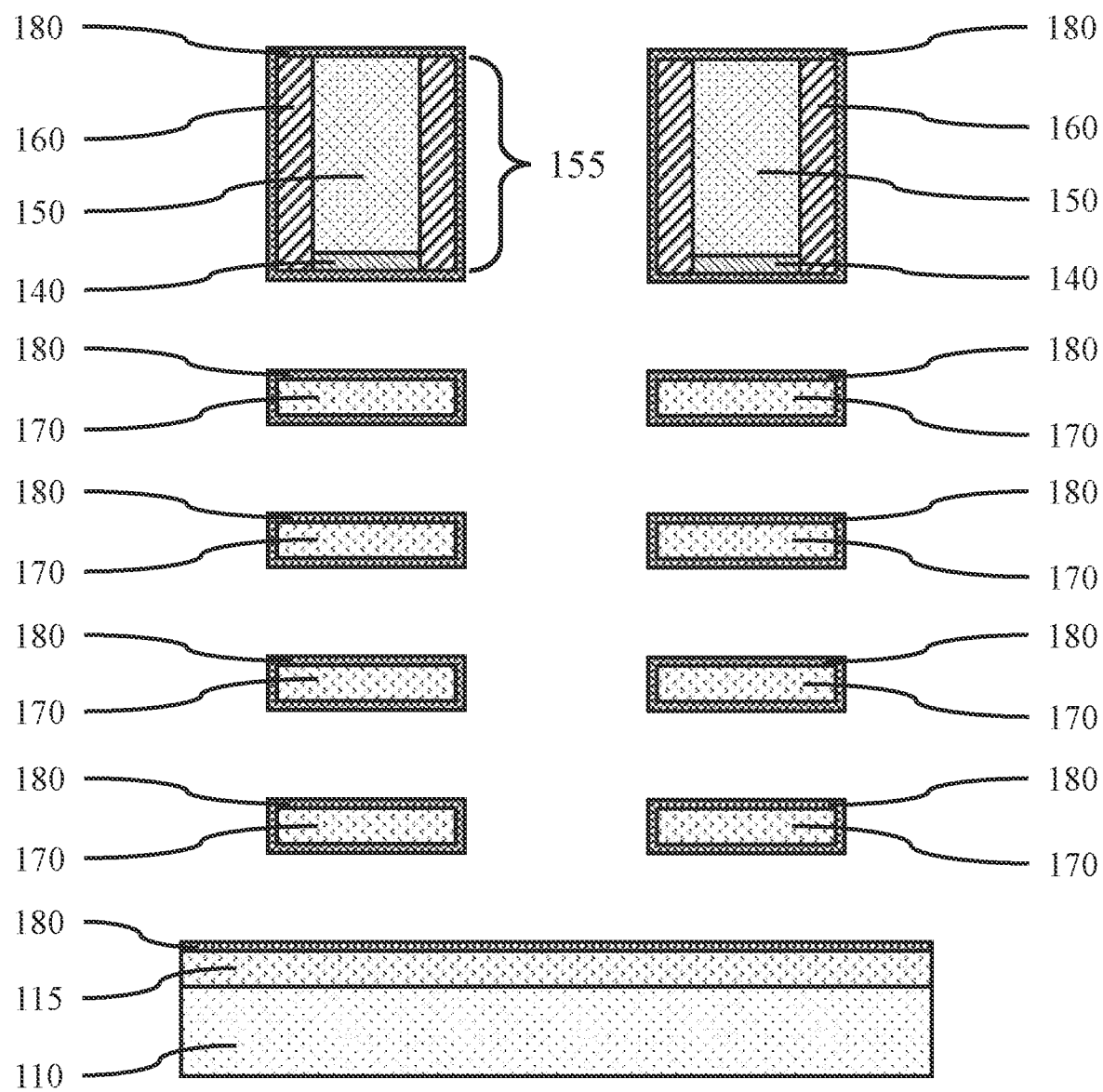
FIG. 4 is a cross-sectional side view showing a first two-dimensional (2D) channel layer formed on the dielectric support bridges and bottom dielectric layer, in accordance with an embodiment of the present invention.

FIG. 4 is a cross-sectional side view showing a first two-dimensional (2D) channel layer formed on the dielectric support bridges and bottom dielectric layer, in accordance with an embodiment of the present invention.

In one or more embodiments, a first two-dimensional (2D) channel layer 180 can be formed on the dielectric support bridges 170 and bottom dielectric layer 115, where the first 2D-channel layer 180 can be formed by chemical vapor deposition (CVD) or a conformal deposition (e.g., ALD, PEALD). In various embodiments, the first two-dimensional (2D) channel layer 180 can be formed on the exposed surfaces of the dummy gate structure 155 and dielectric support bridges 170, where the first two-dimensional (2D) channel layer 180 can wrap around four sides of each of the plurality of dielectric support bridges 170. The first two-dimensional (2D) channel layer 180 can be formed on the surface of the bottom dielectric layer 115 by the deposition.

In one or more embodiments, the first two-dimensional (2D) channel layer 180 can be made of a two-dimensional material, including, but not limited to, indium tin oxides (ITO), indium-aluminum-zinc-oxides (IAZO), transition metal di chalcogenides (TMDC), for example, molybdenum disulfide ($MoS_2$), molybdenum diselenide ($MoSe_2$), tungsten disulfide ($WS_2$), tungsten diselenide ($WSe_2$), graphene, and combinations thereof. The first two-dimensional (2D) channel layer 180 can be a material that does not normally conduct, but is capable of conducting when gate voltage is applied through a dielectric separating layer. In various embodiments, the first two-dimensional (2D) channel layer 180 can be a material having a two-dimensional laminate/graphene-like structure.

In various embodiments, the first two-dimensional (2D) channel layer 180 can have a thickness in a range of about one (1) monolayer to about five (5) monolayers, or about two (2) monolayers to about four (4) monolayers, where the monolayers may be incomplete or have gaps/defects due to formation and processing. The first two-dimensional (2D) channel layer 180 can have a thickness in a range of about 0.5 nm to about 1.5 nm depending on the monolayer thickness of the material.

In a non-limiting exemplary embodiment, a molybdenum disulfide ($MoS_2$) two-dimensional (2D) channel layer 180, for example, can have FEOL device characteristics of: $I_{on}/I_{off}$~108, SS (subthreshold slope)~100 mV/dec, DIBL (drain-induced barrier lowering)<30 mV/V, $L_{gate}$=40-100 nm, $t_{channel}$<1 nm, $I_{on}$=0.4 mA/μm (@ VDS=1V).

Figure 5:
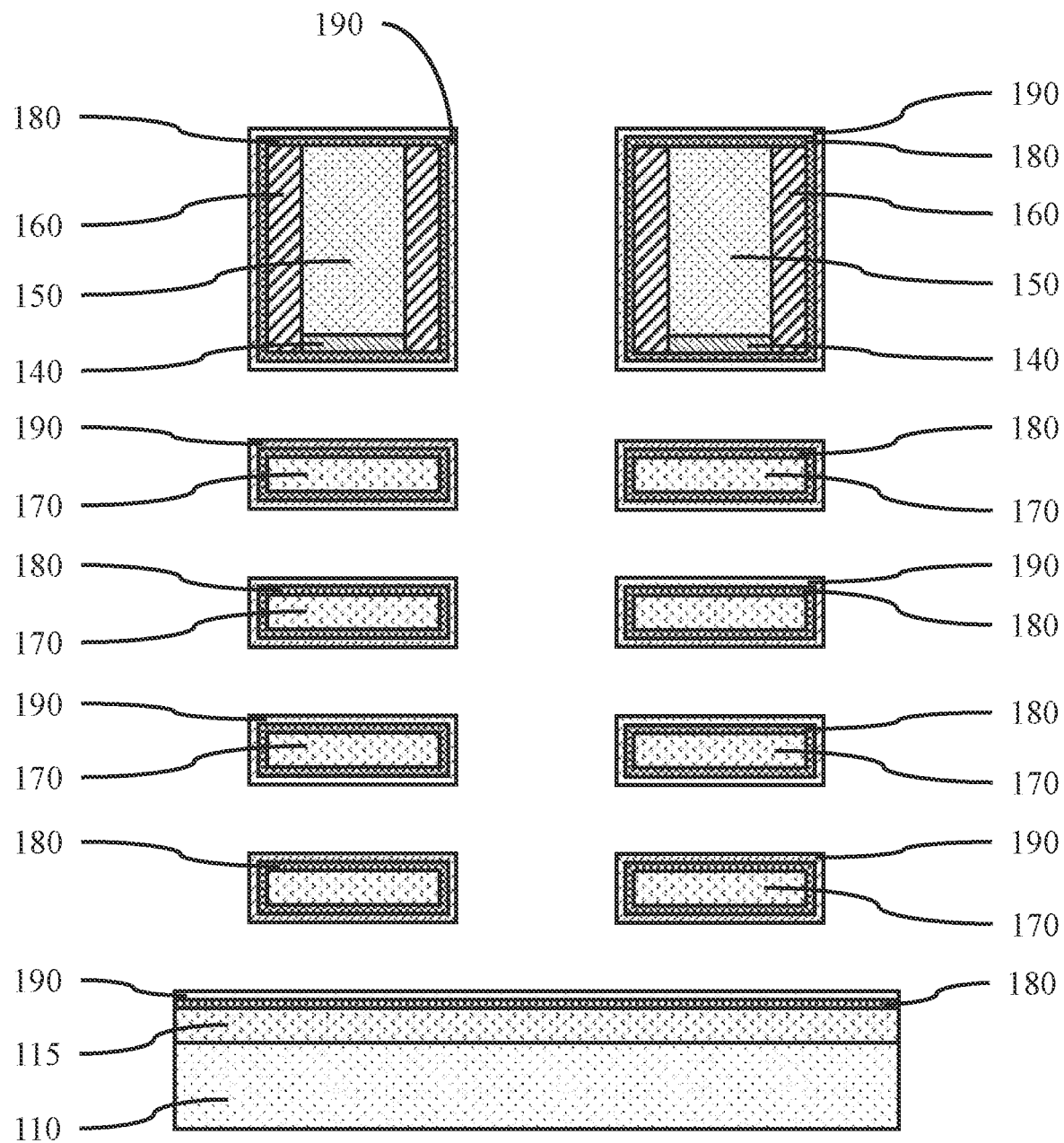
FIG. 5 is a cross-sectional side view showing a first gate dielectric layer formed on the exposed surfaces of the two-dimensional (2D) channel layer, in accordance with an embodiment of the present invention.

FIG. 5 is a cross-sectional side view showing a first gate dielectric layer formed on the exposed surfaces of the two-dimensional (2D) channel layer, in accordance with an embodiment of the present invention.

In one or more embodiments, a first gate dielectric layer 190 can be formed on the exposed surfaces of the two-dimensional (2D) channel layer 180, where the first gate dielectric layer 190 can be formed by a conformal deposition (e.g., ALD, PEALD). The first gate dielectric layer 190 can electrically insulate the first two-dimensional (2D) channel layer 180.

In various embodiments, the first gate dielectric layer 190 can be a high-k insulating, dielectric material, including, but not limited to, metal oxides, such as, hafnium oxide (HfO), hafnium silicon oxide (HfSiO), hafnium silicon oxynitride (HfSiON), lanthanum oxide (LaO), lanthanum aluminum oxide (LaAlO), zirconium oxide (ZrO), zirconium silicon oxide (ZrSiO), zirconium silicon oxynitride (ZrSiON), tantalum oxide (TaO), titanium oxide (TiO), barium strontium titanium oxide (BaSrTiO), barium titanium oxide (BaTiO), strontium titanium oxide (SrTiO), yttrium oxide (YO), aluminum oxide (AlO), lead scandium tantalum oxide (PbScTaO), and lead zinc niobate (PbZnNbO). The high-k material may further include dopants such as lanthanum, aluminum, magnesium, or combinations thereof.

In various embodiments, the first gate dielectric layer 190 can have a thickness in a range of about 0.5 nanometers (nm) to about 3 nm, or about 1 nm to about 2 nm, although other thicknesses are also contemplated. The first gate dielectric layer 190 can have a thickness sufficient to electrical insulation to/between adjacent current-carrying layers.

Figure 6:
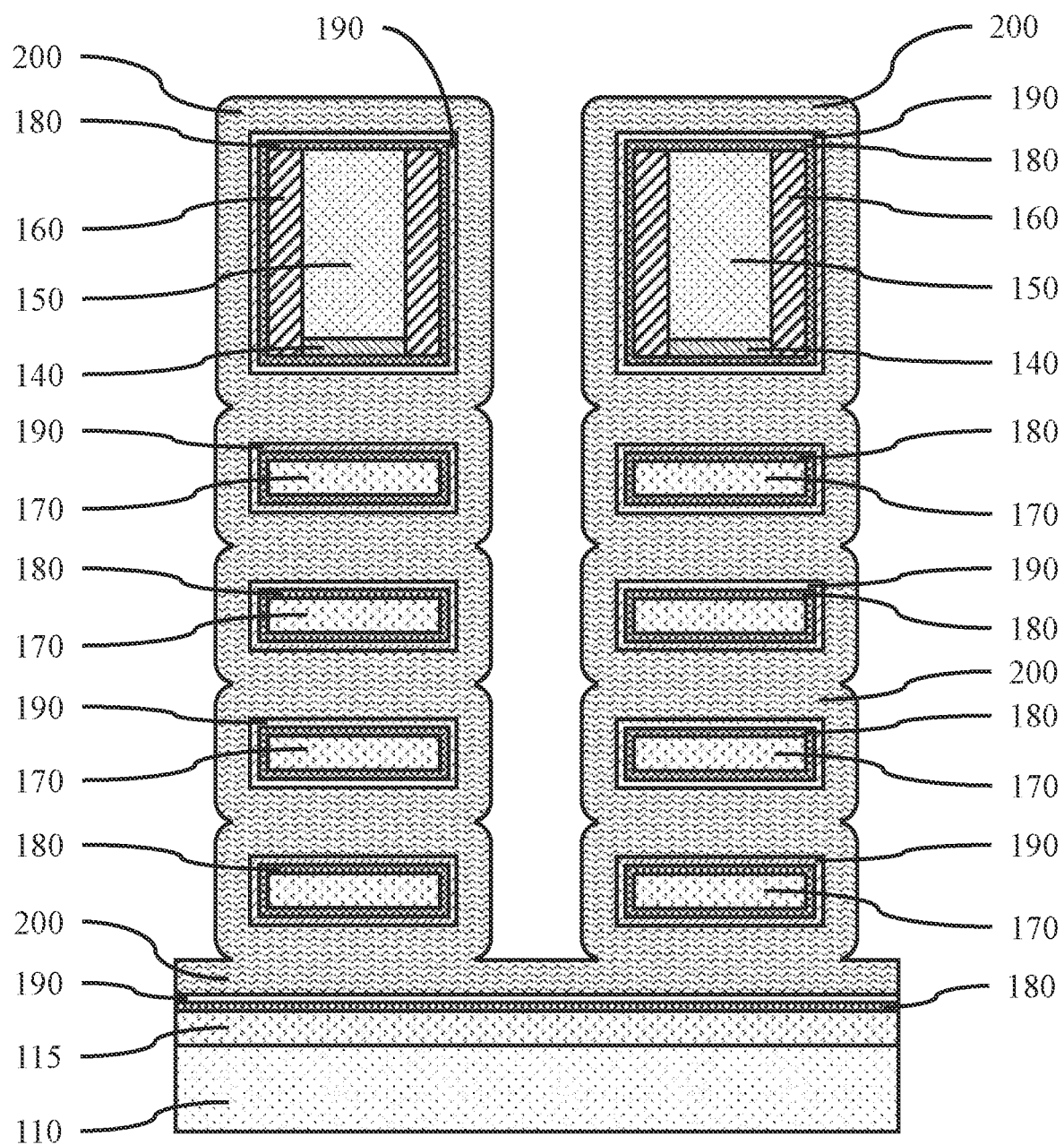
FIG. 6 is a cross-sectional side view showing a disposable fill layer formed on the first gate dielectric layer of each stack, in accordance with an embodiment of the present invention.

FIG. 6 is a cross-sectional side view showing a disposable fill layer formed on the first gate dielectric layer of each stack, in accordance with an embodiment of the present invention.

In one or more embodiments, a disposable fill layer 200 can be formed on the first gate dielectric layer 190 of each stack, where the disposable fill layer 200 can be formed by a conformal deposition (e.g., ALD, PEALD) to fill in the space between adjacent dielectric support bridges 170, such that the disposable fill layer 200 does not pinch off and create a void between adjacent dielectric support bridges 170.

In various embodiments, the disposable fill layer 200 can be a selectively-etchable material relative to the first gate dielectric layer 190, for example, titanium nitride (TiN), titanium carbide (TiC), amorphous silicon (a-Si), amorphous carbon (a-C), amorphous germanium (a-Ge), and combinations thereof.

Figure 7:
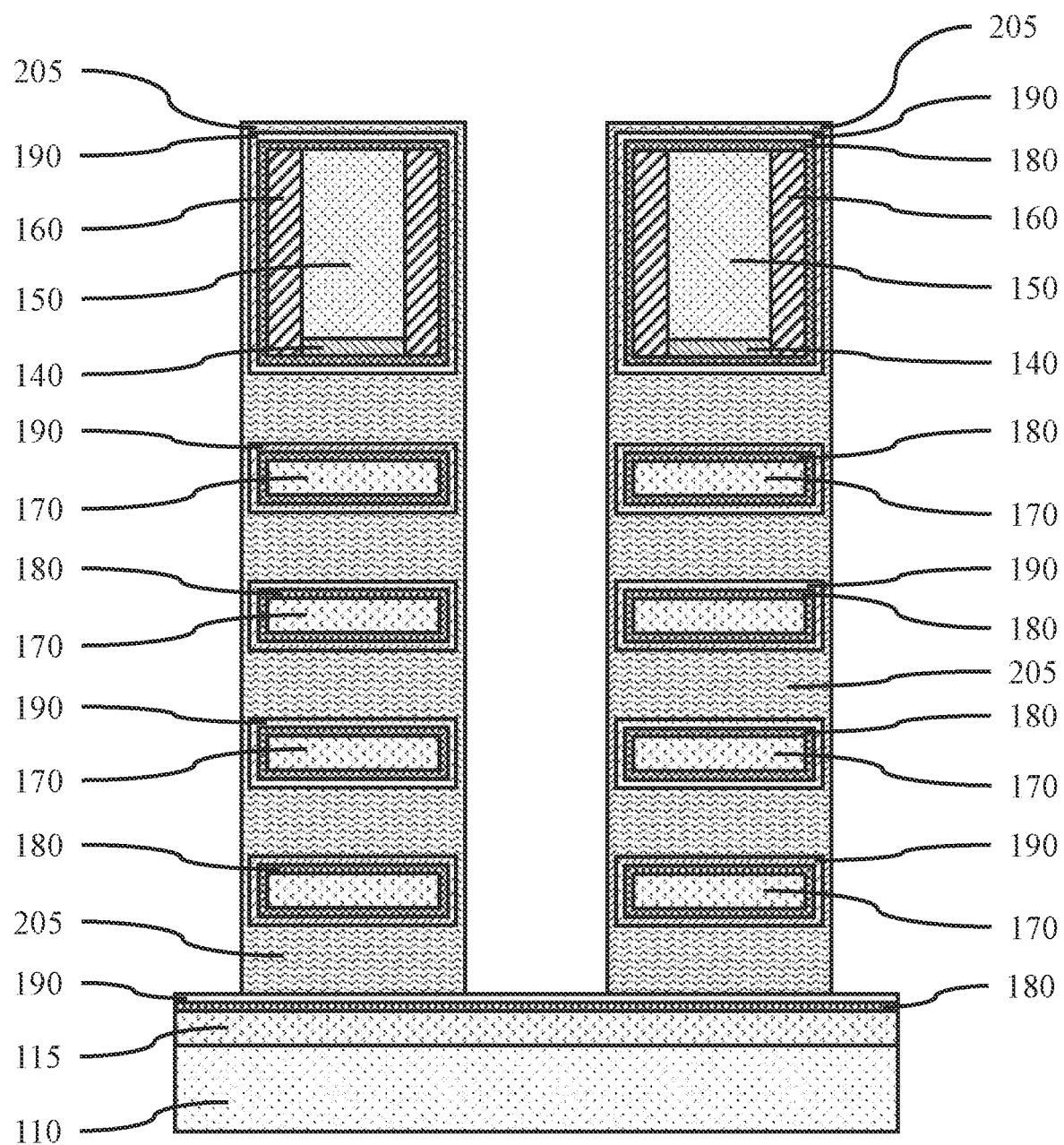
FIG. 7 is a cross-sectional side view showing portions of the disposable fill layer removed from the sidewall surfaces to form disposable filler blocks between the dielectric support bridges, in accordance with an embodiment of the present invention.

FIG. 7 is a cross-sectional side view showing portions of the disposable fill layer removed from the sidewall surfaces to form disposable filler blocks between the dielectric support bridges, in accordance with an embodiment of the present invention.

In one or more embodiments, portions of the disposable fill layer 200 on the sidewalls of the sidewall spacers 160 and first gate dielectric layer 190 of each stack can be removed using a selective, directional etch, for example, a reactive ion etch (RIE), that leaves portions of the disposable fill layer 200 between adjacent dielectric support bridges 170 as disposable filler blocks 205. A thin layer of the disposable fill layer 200 may also remain on the sidewalls of the sidewall spacers 160 and first gate dielectric layer 190.

Figure 8:
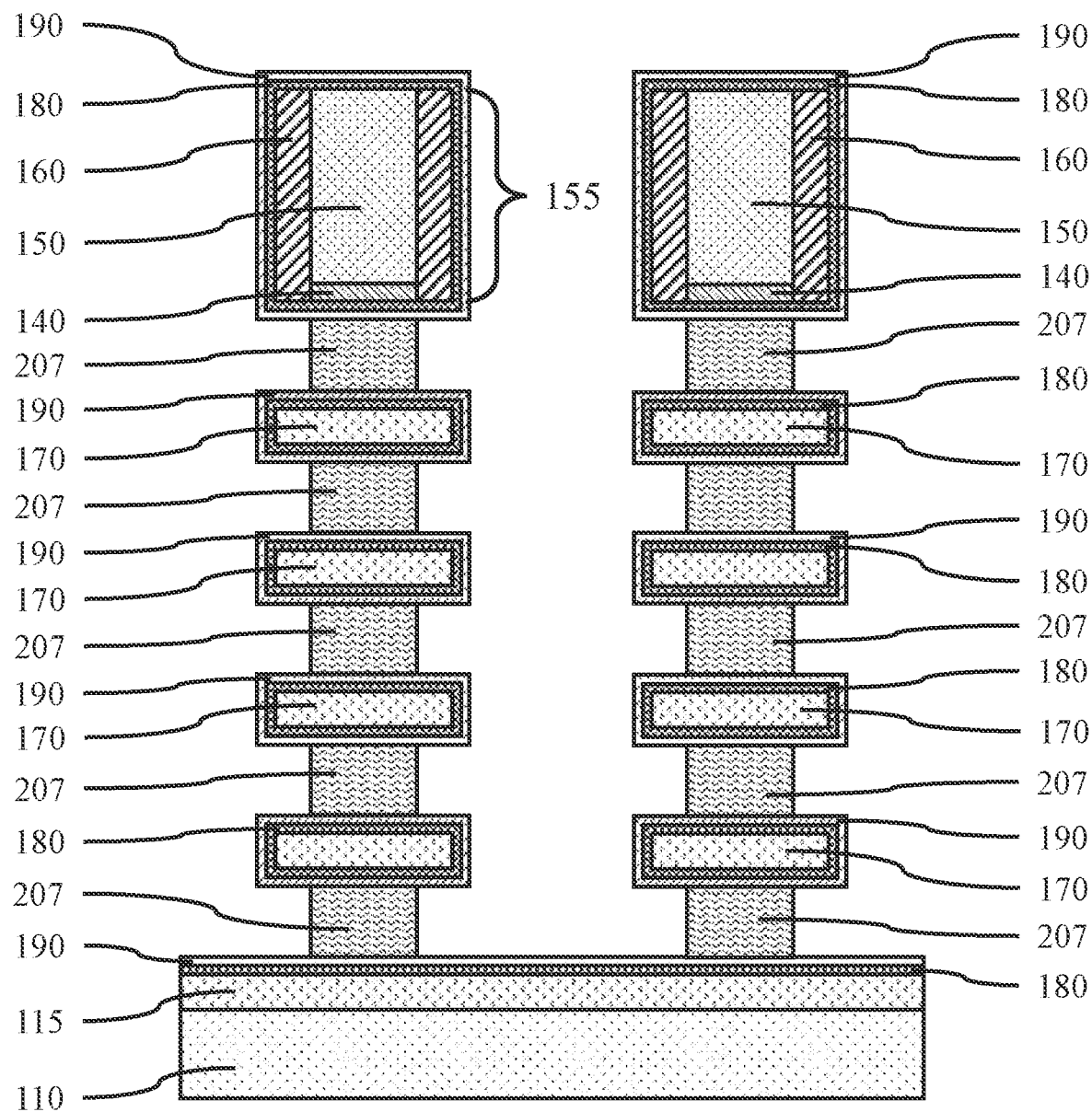
FIG. 8 is a cross-sectional side view showing recessing of the disposable filler blocks, in accordance with an embodiment of the present invention.

FIG. 8 is a cross-sectional side view showing recessing of the disposable filler blocks, in accordance with an embodiment of the present invention.

In one or more embodiments, portions of the disposable filler blocks 205 can be removed using a selective, isotropic etch, for example, a wet chemical etch or dry plasma etch, to form recesses adjoining disposable filler sections 207. The disposable filler sections 207 can be on the first gate dielectric layer 190 between adjacent dielectric support bridges 170. Removal of the portions of the disposable filler blocks 205 can also remove any remaining disposable fill layer 200 on the first gate dielectric layer 190 on the sidewalls of the dummy gate structure 155 and dielectric support bridges 170. Portions of the first gate dielectric layer 190 can be exposed.

In various embodiments, the disposable filler sections 207 can have a width about the same as the width of the dummy gate fill 150 and dummy dielectric layer 140.

Figure 9:
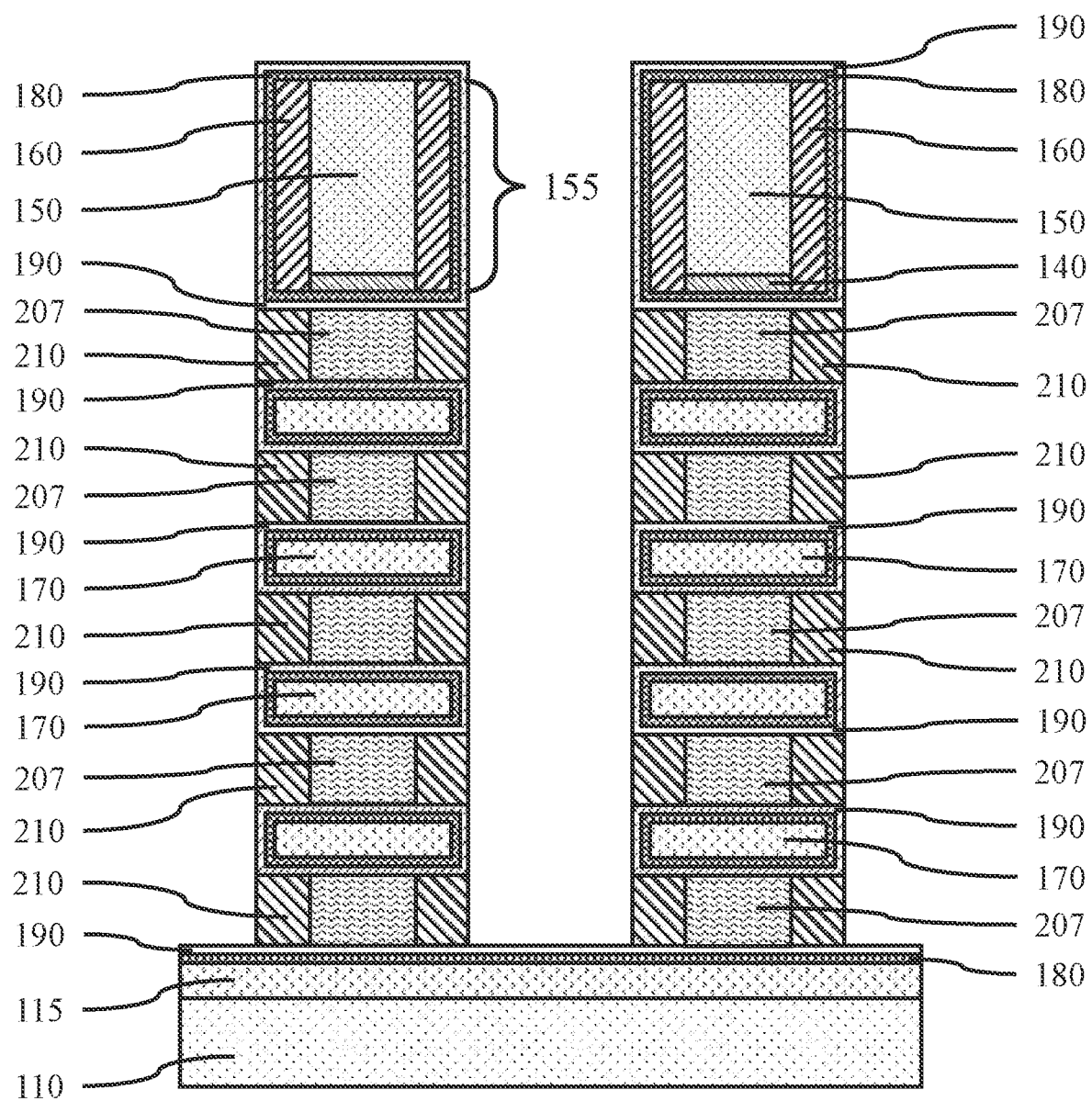
FIG. 9 is a cross-sectional side view showing formation of inner spacers in the recesses adjoining to the disposable filler blocks, in accordance with an embodiment of the present invention.

FIG. 9 is a cross-sectional side view showing formation of inner spacers in the recesses adjoining to the disposable filler blocks, in accordance with an embodiment of the present invention.

In one or more embodiments, an inner spacer 210 can be formed in each of the recesses adjoining the disposable filler sections 207, where the inner spacer 210 can be formed by a conformal deposition and anisotropic etch-back.

In various embodiments, the inner spacers 210 can be a hardmask material, including, but not limited to, silicon oxide (SiO), silicon nitride (SiN), a silicon oxynitride (SiON), a silicon carbonitride (SiCN), a silicon boronitride (SiBN), a silicon borocarbide (SiBC), and combinations thereof. The inner spacers 210 can be the same material as the sidewall spacers 160.

Figure 10:
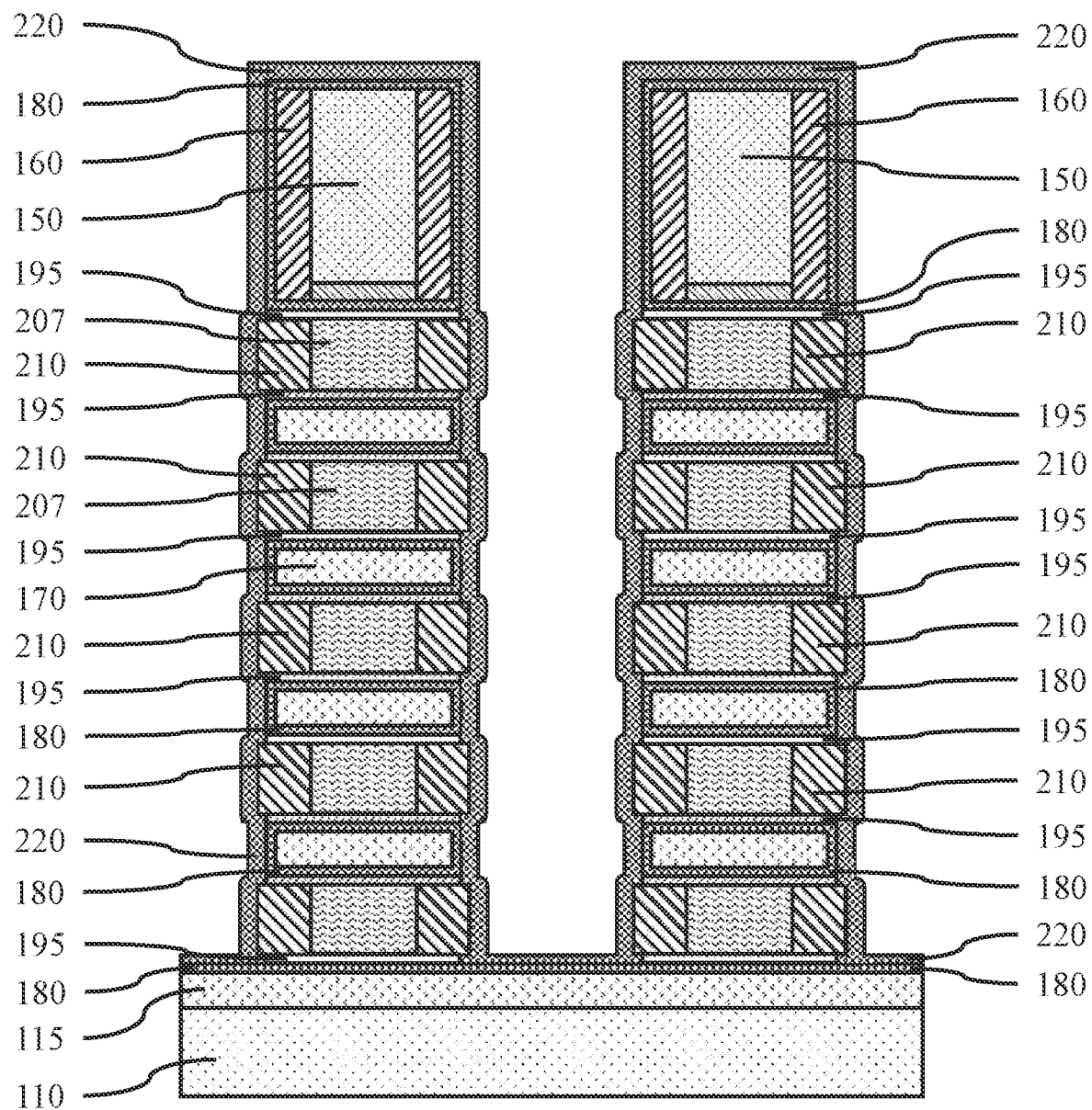
FIG. 10 is a cross-sectional side view showing removal of exposed portions of the first gate dielectric layer, and formation of a second two-dimensional (2D) channel layer on the exposed sides of the inner spacers and the exposed sides of the first two-dimensional (2D) channel layer on the dielectric support bridges, in accordance with an embodiment of the present invention.

FIG. 10 is a cross-sectional side view showing removal of exposed portions of the first gate dielectric layer, and formation of a second two-dimensional (2D) channel layer on the exposed sides of the inner spacers and the exposed sides of the first two-dimensional (2D) channel layer on the dielectric support bridges, in accordance with an embodiment of the present invention.

In one or more embodiments, exposed portions of the first gate dielectric layer 190 can be removed using a selective isotropic etch, for example, a wet chemical etch or dry plasma etch. Removal of the exposed portions of the first gate dielectric layer 190 can exposed the underlying portions of the first two-dimensional (2D) channel layer 180. Removal of the exposed portions of the first gate dielectric layer 190 can form gate dielectric sheets 195 between the first two-dimensional (2D) channel layer 180 on the dielectric support bridges 170 and the disposable filler sections 207. The gate dielectric sheets 195 can extend from one side of the dummy gate structure or dielectric support bridges 170 to the other side. A pair of gate dielectric sheets 195 can be on each of the plurality of dielectric support bridges 170, where a gate dielectric sheet 195 can be on each of the opposite sides of the dielectric support bridge 170.

In one or more embodiments, a second two-dimensional (2D) channel layer 220 can be formed on the exposed sides of the inner spacers 210 and the exposed portions of the first two-dimensional (2D) channel layer 180 on the dielectric support bridges 170 and dummy gate structure 155. The second two-dimensional (2D) channel layer 220 can be formed by a conformal deposition or CVD, that also forms the second two-dimensional (2D) channel layer 220 on the first two-dimensional (2D) channel layer 180 on the bottom dielectric layer 115 and substrate 110.

In various embodiments, the second two-dimensional (2D) channel layer 220 can have a rippled profile on the dielectric support bridges 170 and dummy gate structure 155, where the removal of the portions of the first gate dielectric layer 190 created an uneven surface.

In one or more embodiments, the second two-dimensional (2D) channel layer 220 can be made of a two-dimensional material, including, but not limited to, indium tin oxides (ITO), indium-aluminum-zinc-oxides (IAZO), transition metal di chalcogenides (TMDC), for example, molybdenum disulfide ($MoS_2$), molybdenum diselenide ($MoSe_2$), tungsten disulfide ($WS_2$), tungsten diselenide ($WSe_2$), graphene, and combinations thereof. The second two-dimensional (2D) channel layer 220 can be a material that does not normally conduct, but is capable of conducting when gate voltage is applied through a dielectric separating layer. In various embodiments, the second two-dimensional (2D) channel layer 220 can be a material having a two-dimensional laminate/graphene-like structure.

In various embodiments, the second two-dimensional (2D) channel layer 220 can have a thickness in a range of about one (1) monolayer to about 50 monolayers, or about two (2) monolayers to about four (4) monolayers, where the monolayers may be incomplete or have gaps/defects due to formation and processing. The first two-dimensional (2D) channel layer 180 can have a thickness in a range of about 0.5 nm to about 15 nm, or a range of about 0.5 nm to about 1.5 nm depending on the monolayer thickness of the material. In various embodiments, the second two-dimensional (2D) channel layer 220 can fill the space between stacks of dielectric support bridges 170.

Figure 11:
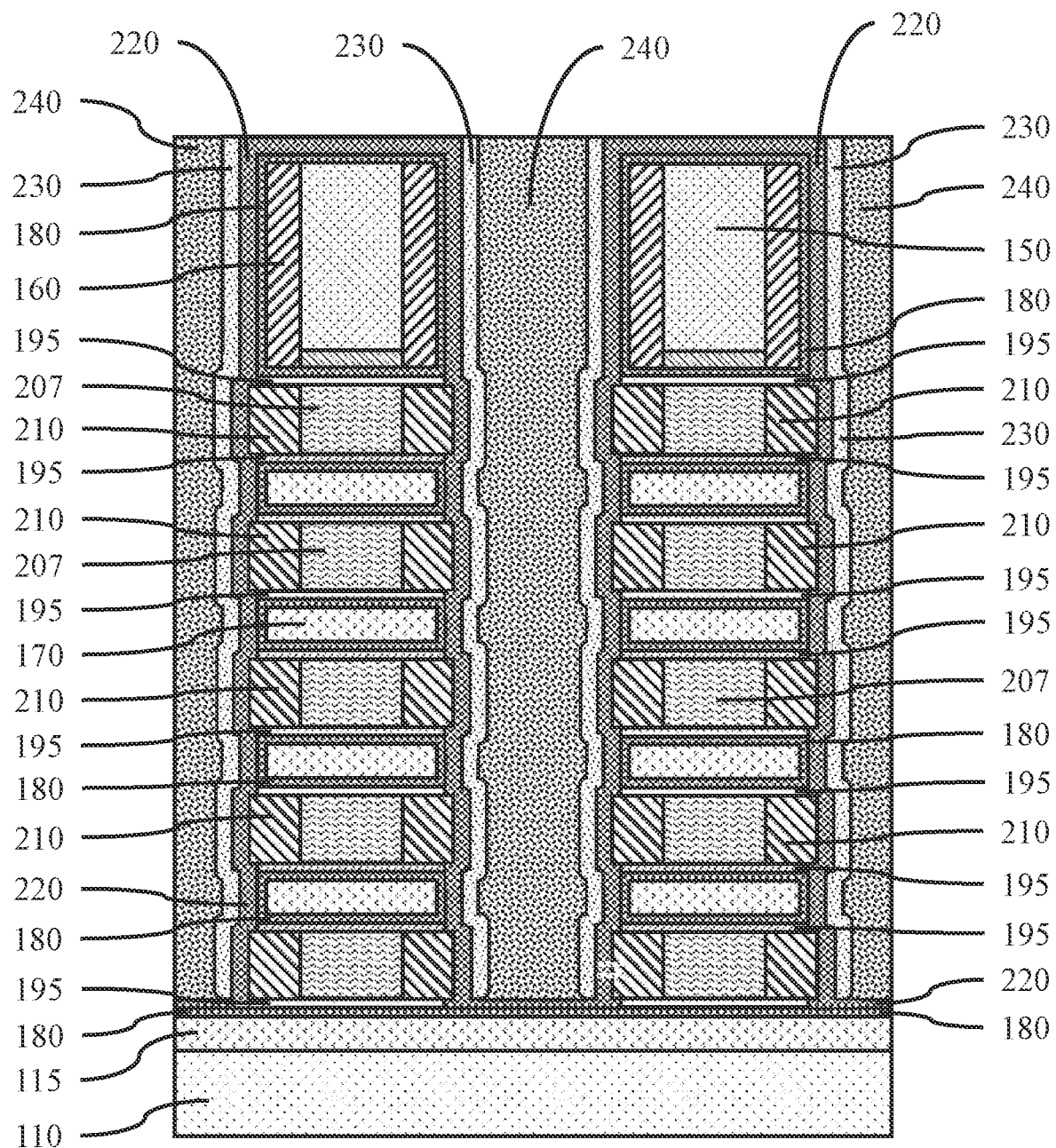
FIG. 11 is a cross-sectional side view showing formation of a first source/drain material layer on the second two-dimensional (2D) channel layer, and a source/drain material fill on the first source/drain material layer, in accordance with an embodiment of the present invention.

FIG. 11 is a cross-sectional side view showing formation of a first source/drain material layer on the second two-dimensional (2D) channel layer, and a source/drain material fill on the first source/drain material layer, in accordance with an embodiment of the present invention.

In one or more embodiments, a first source/drain material layer 230 can be formed on the second two-dimensional (2D) channel layer 220, where the first source/drain material layer 230 can be formed by a conformal deposition (e.g., ALD, PEALD), and etched back using a directional etch (e.g., RIE).

In various embodiments, the first source/drain material layer 230 can be a conductive material that can minimize the contact resistance with the second two-dimensional (2D) channel layer 220, including, but not limited to, semi-metals, for example, bismuth (Bi) and antimony (Sb).

In a non-limiting exemplary embodiment, a bismuth first source/drain material layer 230 can be formed on a molybdenum diselenide ($MoSe_2$) second two-dimensional (2D) channel layer 220, where the contact resistance between the layers is 123 ohm-micrometer.

In various embodiments, the first source/drain material layer 230 can have a thickness in a range of about 3 nanometers (nm) to about 6 nm, or about 3 nm to about 5 nm, or about 4 nm, although other thicknesses are also contemplated.

In one or more embodiments, a source/drain material fill 240 can be formed on the first source/drain material layer 230, where the source/drain material fill 240 can fill in the spaces adjacent to or in between stacks.

In various embodiments, the source/drain material fill 240 can be a conductive material including, but not limited to, a metal, for example, aluminum (Al), tungsten (W), cobalt (Co), molybdenum (Mo), a metal compound, for example, tantalum nitride (TaN), tantalum carbide (TaC), titanium nitride (TiN), titanium carbide (TiC), and combinations thereof.

Figure 12:
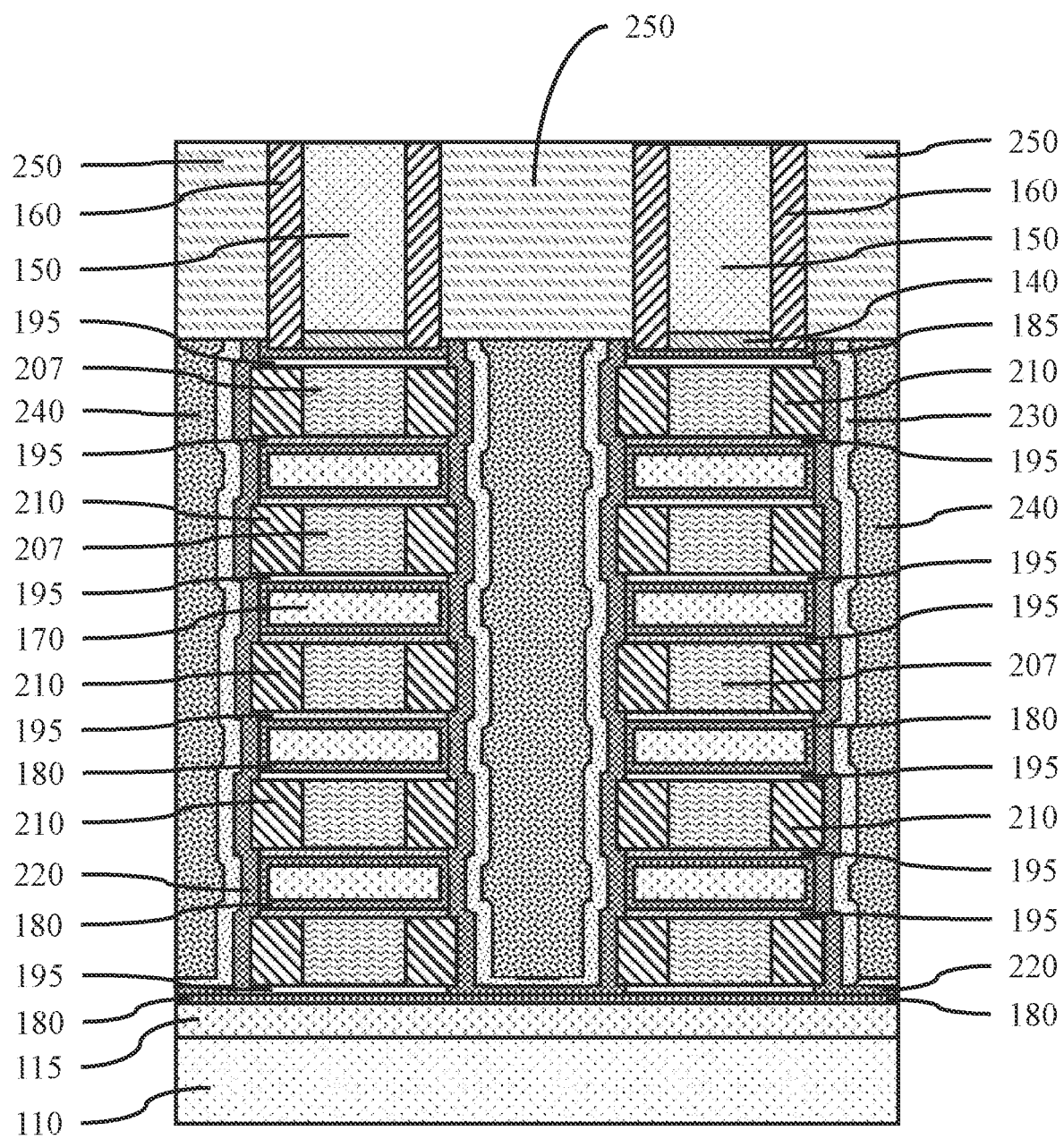
FIG. 12 is a cross-sectional side view showing removal of an upper portion of the source/drain material fill to expose a portion of the first source/drain material layer, and removal of the first source/drain material layer, second two-dimensional (2D) channel layer, and first two-dimensional (2D) channel layer, to expose the sidewall spacers, and formation of an interlayer dielectric (ILD) layer on the source/drain material fill and outside surfaces of the sidewall spacers, in accordance with an embodiment of the present invention.

FIG. 12 is a cross-sectional side view showing removal of an upper portion of the source/drain material fill to expose a portion of the first source/drain material layer, and removal of the first source/drain material layer, second two-dimensional (2D) channel layer, and first two-dimensional (2D) channel layer, to expose the sidewall spacers, and formation of an interlayer dielectric (ILD) layer on the source/drain material fill and outside surfaces of the sidewall spacers, in accordance with an embodiment of the present invention.

In one or more embodiments, an upper portion of the source/drain material fill 240 can be removed to expose a portion of the first source/drain material layer 230, where the upper portion of the source/drain material fill 240 can be removed using a selective isotropic etch. The removal of the upper portion of the source/drain material fill 240 can lower the top surface of the source/drain material fill 240 to between the top surface and the bottom surface of the dummy dielectric layer 140, such that the majority of the second two-dimensional (2D) channel layer 220 on the sidewall spacers 160 is exposed.

In various embodiments, the exposed portion(s) of the second two-dimensional (2D) channel layer 220 and underlying portions of the first two-dimensional (2D) channel layer 180, where the layers are the same 2D material, can be removed using a selective, isotropic etch. Removal of the second two-dimensional (2D) channel layer 220 and underlying portions of the first two-dimensional (2D) channel layer 180 can expose the sidewall spacers 160. Removal of the portions of the first two-dimensional (2D) channel layer 180 can form a two-dimensional (2D) channel sheet 185 on the gate dielectric sheet 195 above the top disposable filler sections 207.

In one or more embodiments, an interlayer dielectric (ILD) layer 250 can be formed on the top surface of the source/drain material fill 240 and the outside surfaces of the sidewall spacers 160, where the interlayer dielectric (ILD) layer 250 can be formed by a blanket deposition, for example, chemical vapor deposition (CVD), plasma enhanced chemical vapor deposition (PECVD), or a combination thereof. A chemical-mechanical polishing (CMP) can be used to removed excess material.

In various embodiments, the interlayer dielectric (ILD) layer 250 can be a dielectric material including, but not limited to, a flowable oxide (FOX), silicon oxide (SiO), silicon nitride (SiN), and other dielectric materials that can be later removed selective to sidewall spacers 160.

Figure 13:
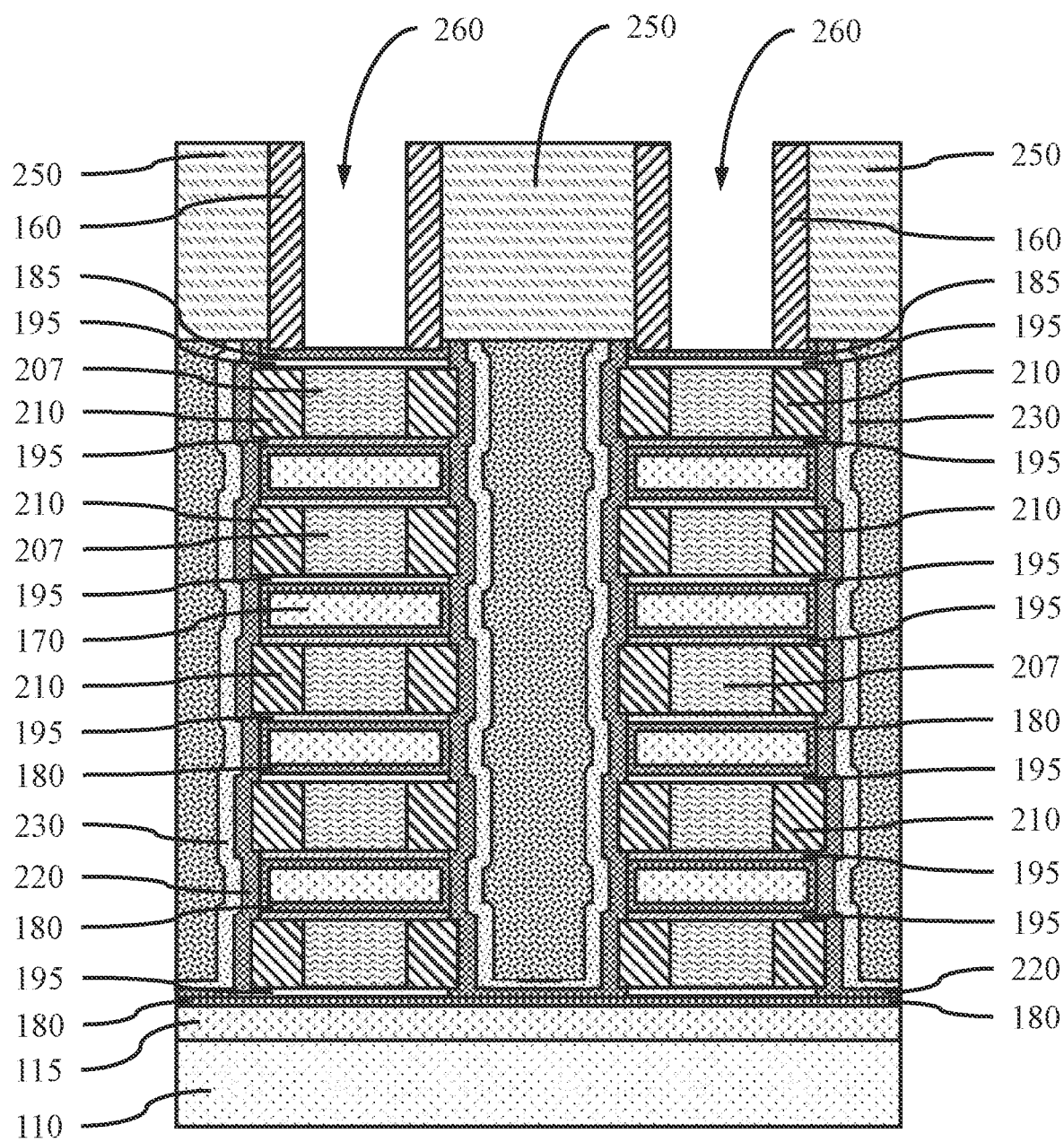
FIG. 13 is a cross-sectional side view showing removal of an upper portion of the dummy gate fill that exposes the dummy dielectric layer and portions of the inside surfaces of the sidewall spacers, and removal of the dummy dielectric layer, in accordance with an embodiment of the present invention.

FIG. 13 is a cross-sectional side view showing removal of an upper portion of the dummy gate fill that exposes the dummy dielectric layer and portions of the inside surfaces of the sidewall spacers, and removal of the dummy dielectric layer, in accordance with an embodiment of the present invention.

In one or more embodiments, an upper portion of the dummy gate fill can be removed to form a gate cavity 260, which exposes the dummy dielectric layer 140 and portions of the inside surfaces of the sidewall spacers 160. The upper portion of the dummy gate fill 150 can be removed using a selective isotropic etch, a selective directional etch (e.g., RIE), or a combination thereof.

Figure 14:
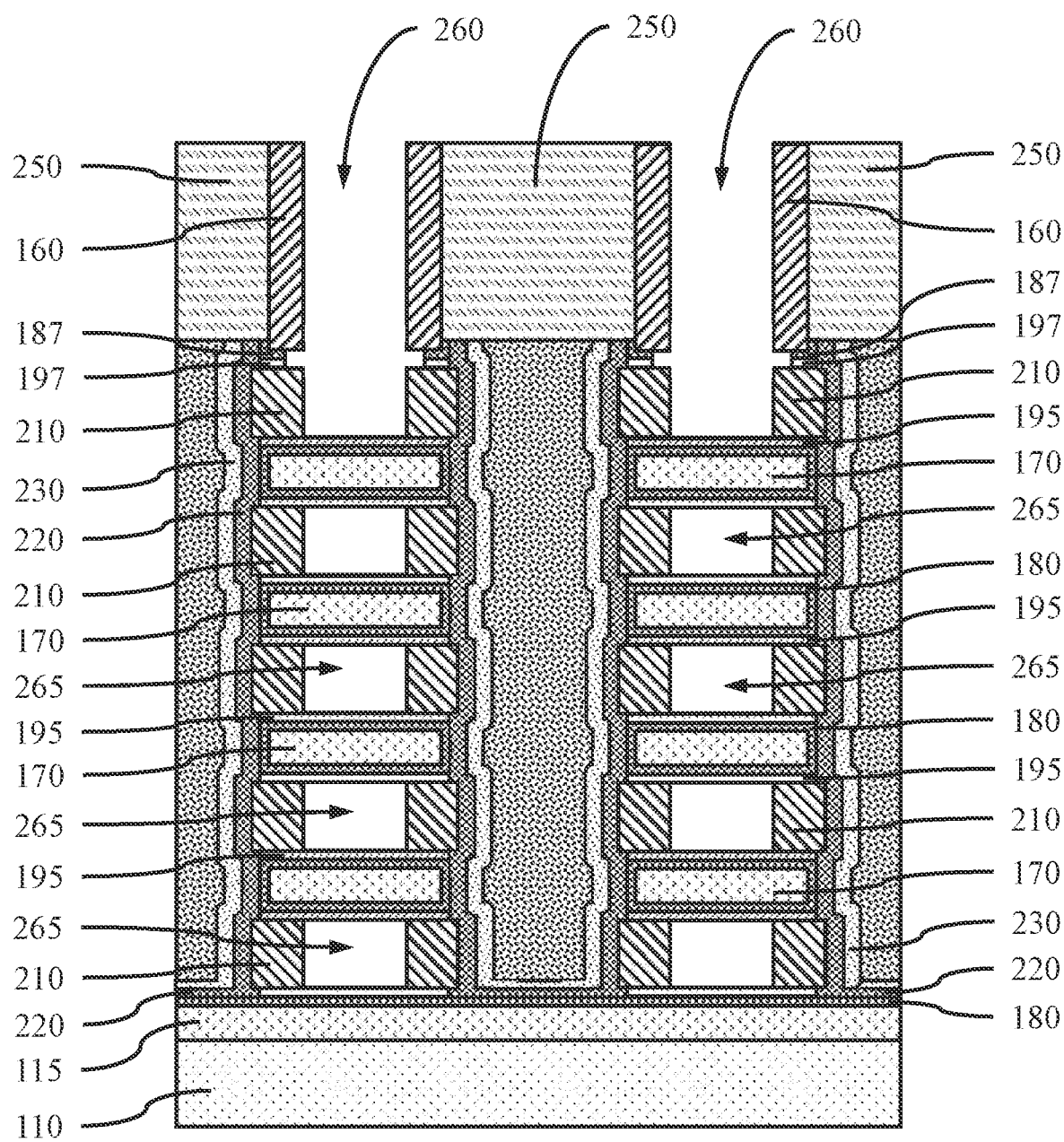
FIG. 14 is a cross-sectional side view showing removal of portions of the first two-dimensional (2D) channel layer and first gate dielectric layer to form a two-dimensional (2D) channel insert and a gate dielectric plug, and removal of the lower portion of the dummy gate fill from between the dielectric support bridges to form gate cavities, in accordance with an embodiment of the present invention.

FIG. 14 is a cross-sectional side view showing removal of portions of the first two-dimensional (2D) channel layer and first gate dielectric layer to form a two-dimensional (2D) channel insert and a gate dielectric plug, and removal of the lower portion of the dummy gate fill from between the dielectric support bridges to form gate cavities, in accordance with an embodiment of the present invention.

In one or more embodiments, portions of the two-dimensional (2D) channel sheet 185 on the gate dielectric sheet 195 can be removed using selective etches to form a two-dimensional (2D) channel insert 187 and a gate dielectric plug 197 between the sidewall spacers 160 and the top inner spacers 210.

In one or more embodiments, the disposable filler sections 207 can be removed using a selective, isotropic etch, where removal of the disposable filler sections 207 exposes gate dielectric sheets 195 on the dielectric support bridges 170 and inner sidewalls of the inner spacers 210. Removal of the disposable filler sections 207 can form intervening gate cavities 265 between the adjacent dielectric support bridges 170.

Figure 15:
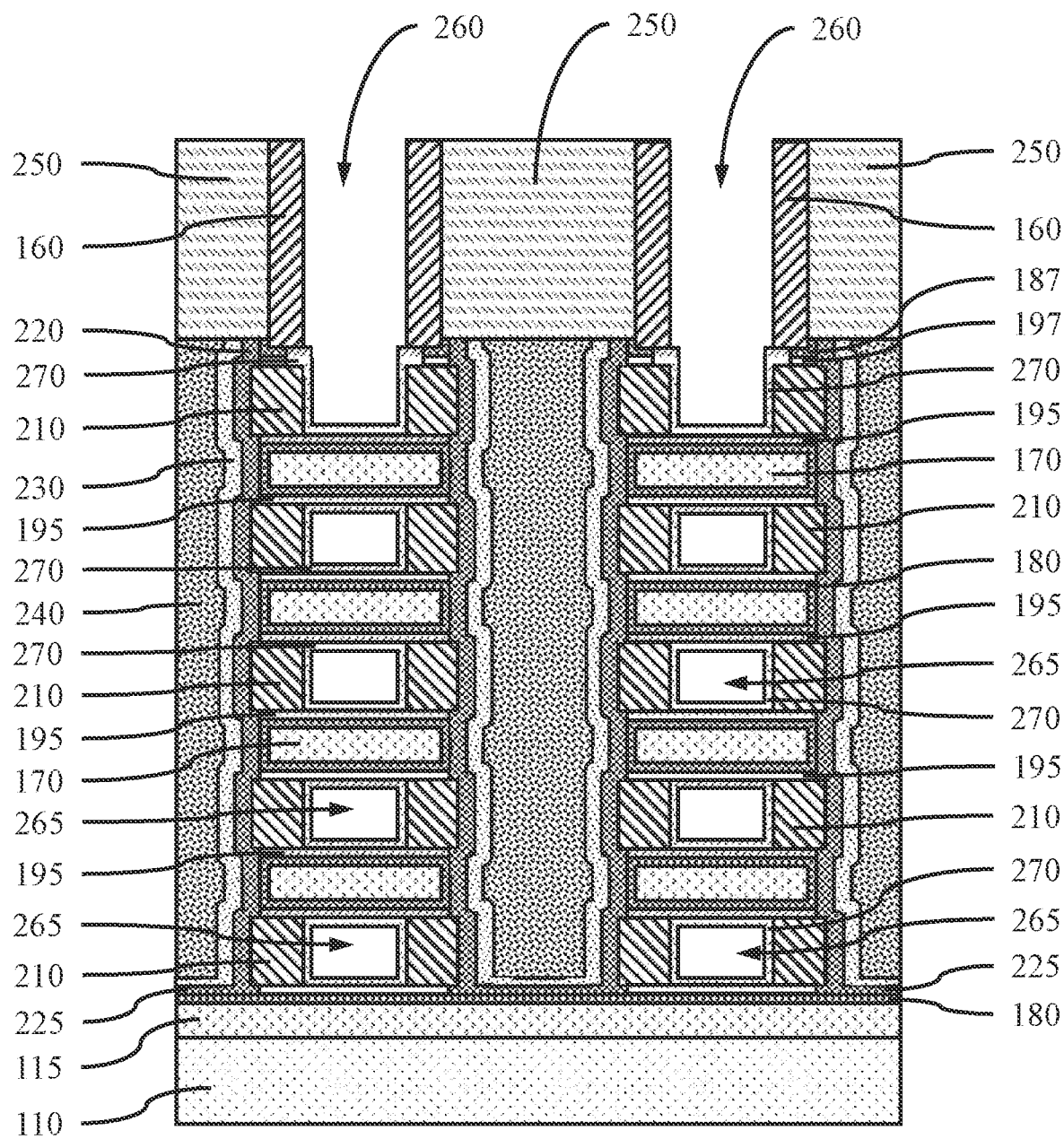
FIG. 15 is a cross-sectional side view showing a second gate dielectric layer formed on the exposed surfaces of the first gate dielectric layer and inner spacers, in accordance with an embodiment of the present invention.

FIG. 15 is a cross-sectional side view showing a second gate dielectric layer formed on the exposed surfaces of the first gate dielectric layer and inner spacers, in accordance with an embodiment of the present invention.

In one or more embodiments, a second gate dielectric layer 270 can be formed on the exposed surfaces of the gate dielectric sheets 195 and inner spacers 210.

In various embodiments, the second gate dielectric layer 270 can be a high-k insulating, dielectric material, including, but not limited to, metal oxides, such as, hafnium oxide (HfO), hafnium silicon oxide (HfSiO), hafnium silicon oxynitride (HfSiON), lanthanum oxide (LaO), lanthanum aluminum oxide (LaAlO), zirconium oxide (ZrO), zirconium silicon oxide (ZrSiO), zirconium silicon oxynitride (ZrSiON), tantalum oxide (TaO), titanium oxide (TiO), barium strontium titanium oxide (BaSrTiO), barium titanium oxide (BaTiO), strontium titanium oxide (SrTiO), yttrium oxide (YO), aluminum oxide (AlO), lead scandium tantalum oxide (PbScTaO), and lead zinc niobate (PbZnNbO). The high-k material may further include dopants such as lanthanum, aluminum, magnesium, or combinations thereof.

Figure 16:
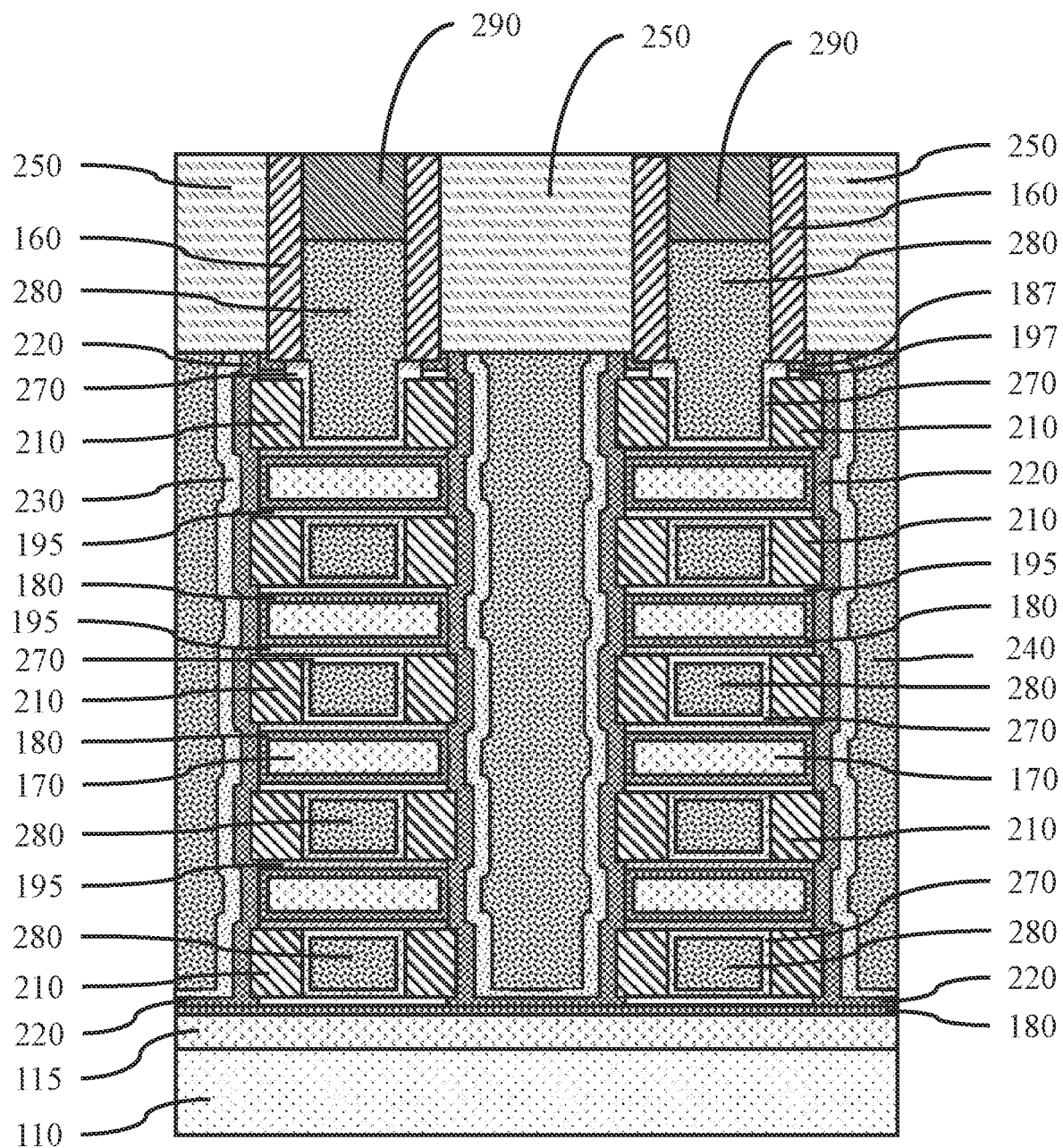
FIG. 16 is a cross-sectional side view showing a conductive gate fill formed on the second gate dielectric layer and within the cavities, and a gate cap formed on the active gate structure, in accordance with an embodiment of the present invention.

FIG. 16 is a cross-sectional side view showing a conductive gate fill formed on the second gate dielectric layer and within the cavities, and a gate cap formed on the active gate structure, in accordance with an embodiment of the present invention.

In one or more embodiments, a conductive gate fill 280 can be formed on the second gate dielectric layer 270 and within the gate cavity 260 and intervening gate cavities 265.

In various embodiments, the conductive gate fill 280 can be a conductive material, including, but not limited to, a metal, for example, aluminum (Al), tungsten (W), cobalt (Co), molybdenum (Mo), a metal compound, for example, tantalum nitride (TaN), tantalum carbide (TaC), titanium nitride (TiN), titanium carbide (TiC), and combinations thereof.

In one or more embodiments, a gate cap 290 can be formed on the active gate structure, including the conductive gate fill 280 and sidewall spacers 160.

In various embodiments, the gate cap 290 can be an insulating, dielectric material, including, but not limited to, silicon oxide (SiO), silicon nitride (SiN), silicon oxynitride (SiON), silicon carbide (SiC), silicon oxycarbide (SiOC), silicon carbonitride (SiCN), silicon oxy carbonitride (SiOCN), silicon boro carbonitride (SiBCN), and combinations thereof.

Figure 17:
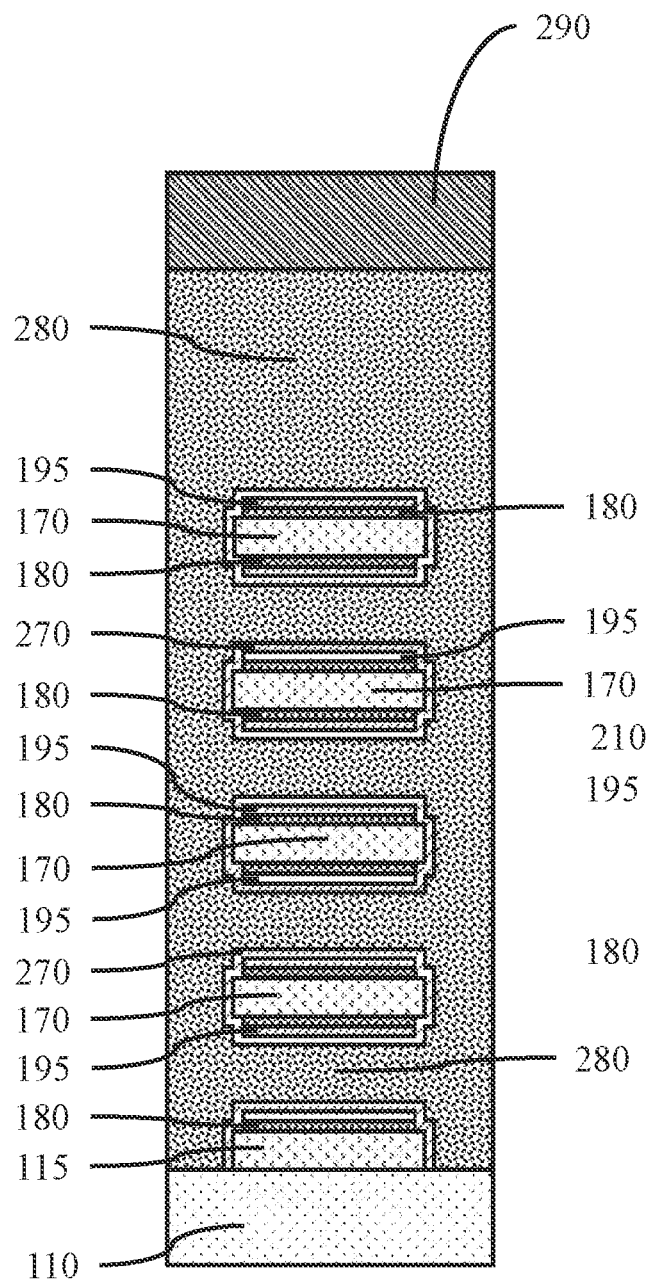
FIG. 17 is a cross-sectional side view through the active gate structure perpendicular to FIG. 16 showing the conductive gate fill formed on the second gate dielectric layer and the gate cap formed on the active gate structure, in accordance with an embodiment of the present invention.

FIG. 17 is a cross-sectional side view through the active gate structure perpendicular to FIG. 16 showing the conductive gate fill formed on the second gate dielectric layer and the gate cap formed on the active gate structure, in accordance with an embodiment of the present invention.

In one or more embodiments, the conductive gate fill 280 can be on four sides of each of the dielectric support bridges 170 and on three sides of the bottom dielectric layer 115. The first two-dimensional (2D) channel layer 180 can be on opposite sides of each dielectric support bridges 170, and on a top surface of the bottom dielectric layer 115. The gate dielectric sheets 195 can be on each of the first two-dimensional (2D) channel layers 180, and the second gate dielectric layer 270 can be around the gate dielectric sheets 195, first two-dimensional (2D) channel layer 180, and dielectric support bridges 170. The gate cap 290 can be on the conductive gate fill 280.

Figure 18:
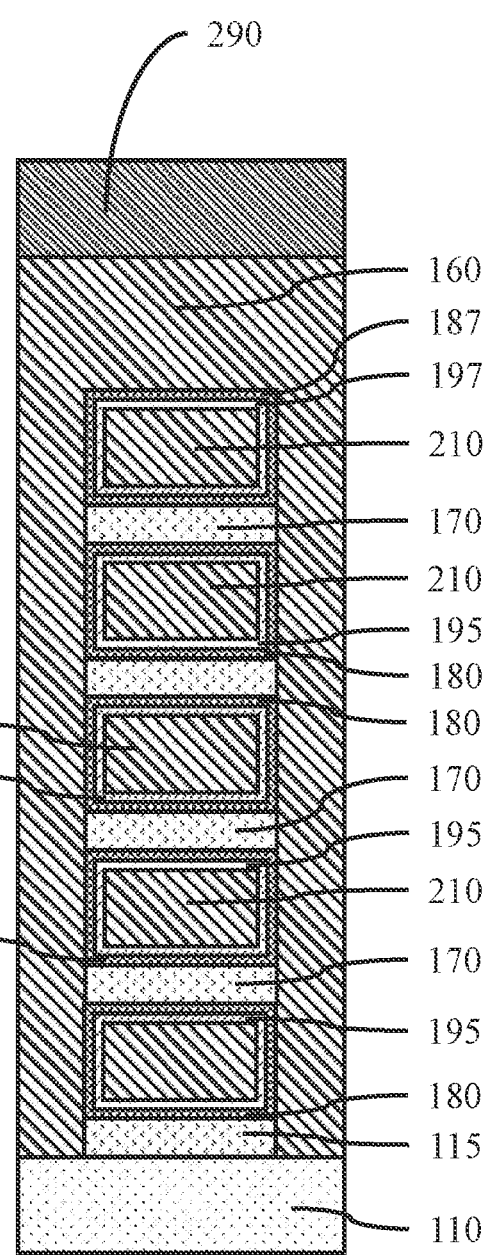
FIG. 18 is a cross-sectional side view through a sidewall spacer and inner spacers, perpendicular to FIG. 16 and parallel with FIG. 17, showing the sidewall spacer and inner spacers on the gate dielectric sheets and the first two-dimensional (2D) channel layers, in accordance with an embodiment of the present invention.

FIG. 18 is a cross-sectional side view through a sidewall spacer and inner spacers, perpendicular to FIG. 16 and parallel with FIG. 17, showing the sidewall spacer and inner spacers on the gate dielectric sheets and the first two-dimensional (2D) channel layers, in accordance with an embodiment of the present invention.

The first two-dimensional (2D) channel layer 180 can be on opposite sides of each dielectric support bridges 170, and on a top surface of the bottom dielectric layer 115, where the first two-dimensional (2D) channel layer 180 can wrap around four sides of the gate dielectric sheets 195 and inner spacers 210. The gate dielectric sheets 195 can wrap around the inner spacers 210. The sidewall spacer 160 can be on the outer surfaces of the first two-dimensional (2D) channel layer 180. The two-dimensional (2D) channel insert 187 and a gate dielectric plug 197 are shortened portions of the first two-dimensional (2D) channel layer 180 and gate dielectric sheets 195 on the top surface of the top inner spacer 210, which do not extend into the active gate structure, as shown in FIG. 17.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including", when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative: terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

Having described preferred embodiments of a device and method of fabricating the device (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A stacked device, comprising:
    a plurality of dielectric support bridges on a substrate;
    a first two-dimensional (2D) channel layer on a first side of each of the plurality of dielectric support bridges;
    a gate dielectric sheet on the first two-dimensional (2D) channel layer;
    a second two-dimensional (2D) channel layer having a vertical rippled profile that conforms on a second side of the first two-dimensional (2D) channel layer, the vertical rippled profile following an uneven surface on the plurality of dielectric support bridges; and
    a second gate dielectric layer on the gate dielectric sheet.

2. The stacked device of claim 1, wherein the first two-dimensional (2D) channel layer wraps around four sides of each of the plurality of dielectric support bridges.

3. The stacked device of claim 1, wherein there is a pair of gate dielectric sheets on each of the plurality of dielectric support bridges.

4. The stacked device of claim 1, wherein the plurality of dielectric support bridges are made of silicon oxide (SiO).

5. The stacked device of claim 1, further comprising a source/drain material fill on the second two-dimensional (2D) channel layer.

6. The stacked device of claim 5, further comprising a first source/drain material layer between the source/drain material fill and the second two-dimensional (2D) channel layer.

7. The stacked device of claim 6, further comprising a bottom dielectric layer between the substrate and the plurality of dielectric support bridges.

8. The stacked device of claim 7, further comprising an active gate structure between one or more pairs of gate dielectric sheets.

9. The stacked device of claim 8, further comprising further comprising an inner spacer on opposite sides of each of the active gate structures.

10. A stacked device, comprising:
a bottom dielectric layer on a substrate;
a plurality of dielectric support bridges on the bottom dielectric layer;
a first two-dimensional (2D) channel layer on a first side of each of the plurality of dielectric support bridges and on the bottom dielectric layer;
a gate dielectric sheet on a second side of the first two-dimensional (2D) channel layer;
a second two-dimensional (2D) channel layer having a vertical rippled profile that conforms on the first two-dimensional (2D) channel layer, the vertical rippled profile following an uneven surface on the plurality of dielectric support bridges; and
a second gate dielectric layer on the gate dielectric sheet.

11. The stacked device of claim 10, wherein the first two-dimensional (2D) channel layer is a material selected from the group consisting of indium tin oxide (ITO), indium-aluminum-zinc-oxide (IAZO), molybdenum disulfide ($MoS_2$), molybdenum diselenide ($MoSe_2$), tungsten disulfide ($WS_2$), and tungsten diselenide ($WSe_2$).

12. The stacked device of claim 11, wherein the second two-dimensional (2D) channel layer is a material selected from the group consisting of indium tin oxide (ITO), indium-aluminum-zinc-oxide (IAZO), molybdenum disulfide ($MoS_2$), molybdenum diselenide ($MoSe_2$), tungsten disulfide ($WS_2$), and tungsten diselenide ($WSe_2$).

13. The stacked device of claim 12, further comprising a first source/drain material layer on the second two-dimensional (2D) channel layer.

14. The stacked device of claim 13, further comprising a source/drain material fill.

15. The stacked device of claim 14, further comprising an active gate structure between one or more pairs of gate dielectric sheets.

16. The stacked device of claim 15, wherein the first source/drain material layer is a material selected from the group consisting of bismuth (Bi) and antimony (Sb).

17. The stacked device of claim 16, wherein the source/drain material fill is a conductive material selected from the group consisting of aluminum (Al), tungsten (W), cobalt (Co), molybdenum (Mo), tantalum nitride (TaN), tantalum carbide (TaC), titanium nitride (TiN), titanium carbide (TiC), and combinations thereof.

18. A method of forming a stacked device, comprising:
forming one or more stacks of alternating sacrificial layers and bridging layers on a substrate;
removing the sacrificial layers to expose opposite sides of the bridging layers;
converting the bridging layers to dielectric support bridges;
forming a first two-dimensional (2D) channel layer on a first side of the exposed surfaces of the dielectric support bridges;
forming a first gate dielectric layer on the first two-dimensional (2D) channel layer;
forming disposable filler sections between the dielectric support bridges;
removing portions of the first gate dielectric layer on exposed sides of the first two-dimensional (2D) channel layer; and
forming a second two-dimensional (2D) channel layer within the portions along a second side of the first two-dimensional (2D) channel layer to form a vertical rippled profile.

19. The method of claim 18, further comprising forming a first source/drain material layer are formed on the second two-dimensional (2D) channel layer.

20. The method of claim 19, further comprising forming a source/drain material fill on the first source/drain material layer.

* * * * *